United States Patent
Furukawa et al.

(10) Patent No.: US 11,296,610 B2
(45) Date of Patent: Apr. 5, 2022

(54) POWER CONVERSION DEVICE, POWER CONVERSION DEVICE CONTROL DEVICE, AND POWER CONVERSION DEVICE CONTROL METHOD

(71) Applicant: Hitachi, Ltd., Tokyo (JP)

(72) Inventors: Kimihisa Furukawa, Tokyo (JP); Shintaro Tanaka, Tokyo (JP); Takae Shimada, Tokyo (JP); Akihiko Kanouda, Tokyo (JP); Mizuki Nakahara, Tokyo (JP); Yuuichi Mabuchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 482 days.

(21) Appl. No.: 16/331,322

(22) PCT Filed: Dec. 21, 2016

(86) PCT No.: PCT/JP2016/088255
§ 371 (c)(1),
(2) Date: Mar. 7, 2019

(87) PCT Pub. No.: WO2018/116431
PCT Pub. Date: Jun. 28, 2018

(65) Prior Publication Data
US 2021/0305903 A1    Sep. 30, 2021

(51) Int. Cl.
*H02M 3/335*    (2006.01)
*H02M 1/00*    (2006.01)
(Continued)

(52) U.S. Cl.
CPC .. *H02M 3/33592* (2013.01); *G01R 19/16538* (2013.01); *H02M 1/0006* (2021.05);
(Continued)

(58) Field of Classification Search
CPC .. H02M 3/003; H02M 3/335; H02M 3/33507; H02M 3/33523; H02M 3/33573;
(Continued)

(56) References Cited

U.S. PATENT DOCUMENTS

| | | |
|---|---|---|
| 3,517,300 A | 6/1970 | McMurray |
| 5,027,264 A | 6/1991 | DeDoncker et al. |

(Continued)

FOREIGN PATENT DOCUMENTS

| | | |
|---|---|---|
| JP | 2006-81263 A | 3/2006 |
| WO | WO 2007/145388 A1 | 12/2007 |
| WO | WO 2014/103105 A1 | 7/2014 |

OTHER PUBLICATIONS

International Search Report (PCT/ISA/210) issued in PCT Application No. PCT/JP2016/088255 dated Feb. 7, 2017 with English translation (three (3) pages).
(Continued)

*Primary Examiner* — Yemane Mehari
(74) *Attorney, Agent, or Firm* — Crowell & Moring LLP

(57) ABSTRACT

An object of the present invention is to sufficiently reduce a switching loss. A control device causes a positive electrode of a first voltage to appear at a second connection point by switching second and third switching elements to an ON state. Next, the control device causes the positive electrode of the first voltage to appear at a first connection point by switching the second and third switching elements to an OFF state. After that, fifth and eighth switching elements are switched to the OFF state, and sixth and seventh switching elements are switched to the ON state.

4 Claims, 13 Drawing Sheets

(51) Int. Cl.
*H02M 3/00* (2006.01)
*G01R 19/165* (2006.01)

(52) U.S. Cl.
CPC ....... *H02M 1/0009* (2021.05); *H02M 1/0058* (2021.05); *H02M 3/003* (2021.05); *H02M 3/33584* (2013.01)

(58) Field of Classification Search
CPC ......... H02M 3/33584; H02M 3/33592; H02M 1/0006; H02M 1/0009; H02M 1/0058; G01R 19/16538
USPC ..................... 363/21.02–21.04, 21.07, 21.14
See application file for complete search history.

(56) References Cited

U.S. PATENT DOCUMENTS

| | | | |
|---|---|---|---|
| 9,287,790 B2* | 3/2016 | Norisada | H02M 3/3353 |
| 9,537,401 B2* | 1/2017 | Hembach | H02M 3/28 |
| 9,595,841 B2* | 3/2017 | Shimada | H02M 1/32 |
| 2015/0333634 A1 | 11/2015 | Yoshida et al. | |
| 2016/0344297 A1* | 11/2016 | Lee | H02M 3/33592 |
| 2017/0187297 A1* | 6/2017 | Narita | H02M 3/33584 |

OTHER PUBLICATIONS

Japanese-language Written Opinion (PCT/ISA/237) issued in PCT Application No. PCT/JP2016/088255 dated Feb. 7, 2017 (three (3) pages).

* cited by examiner

POWER CONVERSION DEVICE, POWER CONVERSION DEVICE CONTROL DEVICE, AND POWER CONVERSION DEVICE CONTROL METHOD

TECHNICAL FIELD

The present invention relates to a power conversion device, a power conversion device control device, and a power conversion device control method.

BACKGROUND ART

Patent Literature 1 described below is known concerning a power conversion circuit such as a DC-DC conversion device.

CITATION LIST

Patent Literature

Patent Literature 1: U.S. Pat. No. 3,517,300 B

SUMMARY OF INVENTION

Technical Problem

For a power conversion circuit such as a DC-DC conversion device, it is desirable to reduce a switching loss and achieve efficiency improvement and a reduction in the size of the device. However, with the technique described in Patent Literature 1, the switching loss sometimes cannot be sufficiently reduced or an operation range in which the switching loss can be reduced is narrow.

The present invention has been devised in view of the circumstances explained above, and an object of the present invention is to provide a power conversion device, a power conversion device control device, and a power conversion device control method that can sufficiently reduce a switching loss.

Solution to Problem

To solve the above problems, a power conversion device according to the present invention includes: first and second switching elements connected in series via a first connection point between a positive electrode and a negative electrode of a first DC system; third and fourth switching elements connected in series via a second connection point between the positive electrode and the negative electrode of the first DC system; fifth and sixth switching elements connected in series via a third connection point between a positive electrode and a negative electrode of a second DC system; seventh and eighth switching elements connected in series via a fourth connection point between the positive electrode and the negative electrode of the second DC system; a transformer including a first winding connected between the first and second connection points, a first voltage appearing between both ends of the first winding, a first current flowing through the first winding, and a second winding connected between the third and fourth connection points, a second voltage appearing both ends of the second winding, a second current flowing through the second winding; and a control device that controls ON/OFF states of the first to eighth switching elements. The control device includes: a first control unit that repeats, in every predetermined cycle in a state where the second and third switching elements are in the OFF state and an absolute value of the first current is equal to or smaller than a peak value of the first current, an operation including causing a positive electrode of the first voltage to appear at the second connection point by switching the second and third switching elements to the ON state; a second control unit that repeats, in the every cycle when a first predetermined period elapses after the first control unit operates, an operation including causing the positive electrode of the first voltage to appear at the first connection point by switching the second and third switching elements to the OFF state; and a third control unit that repeats, in the every cycle after the second control unit operates and after the positive electrode of the first voltage appears at the second connection point, an operation including switching the fifth and eighth switching elements to the OFF state and switching the sixth and seventh switching elements to the ON state.

Advantageous Effects of Invention

According to the present invention, it is possible to sufficiently reduce a switching loss of the power conversion device.

BRIEF DESCRIPTION OF DRAWINGS

FIG. 2 is an equivalent circuit diagram of a transformer and the like;

DESCRIPTION OF EMBODIMENTS

First Embodiment

<Configuration in a First Embodiment>

First, the configuration of a power conversion device A1 according to a first embodiment of the present invention is explained.

Figure 1:
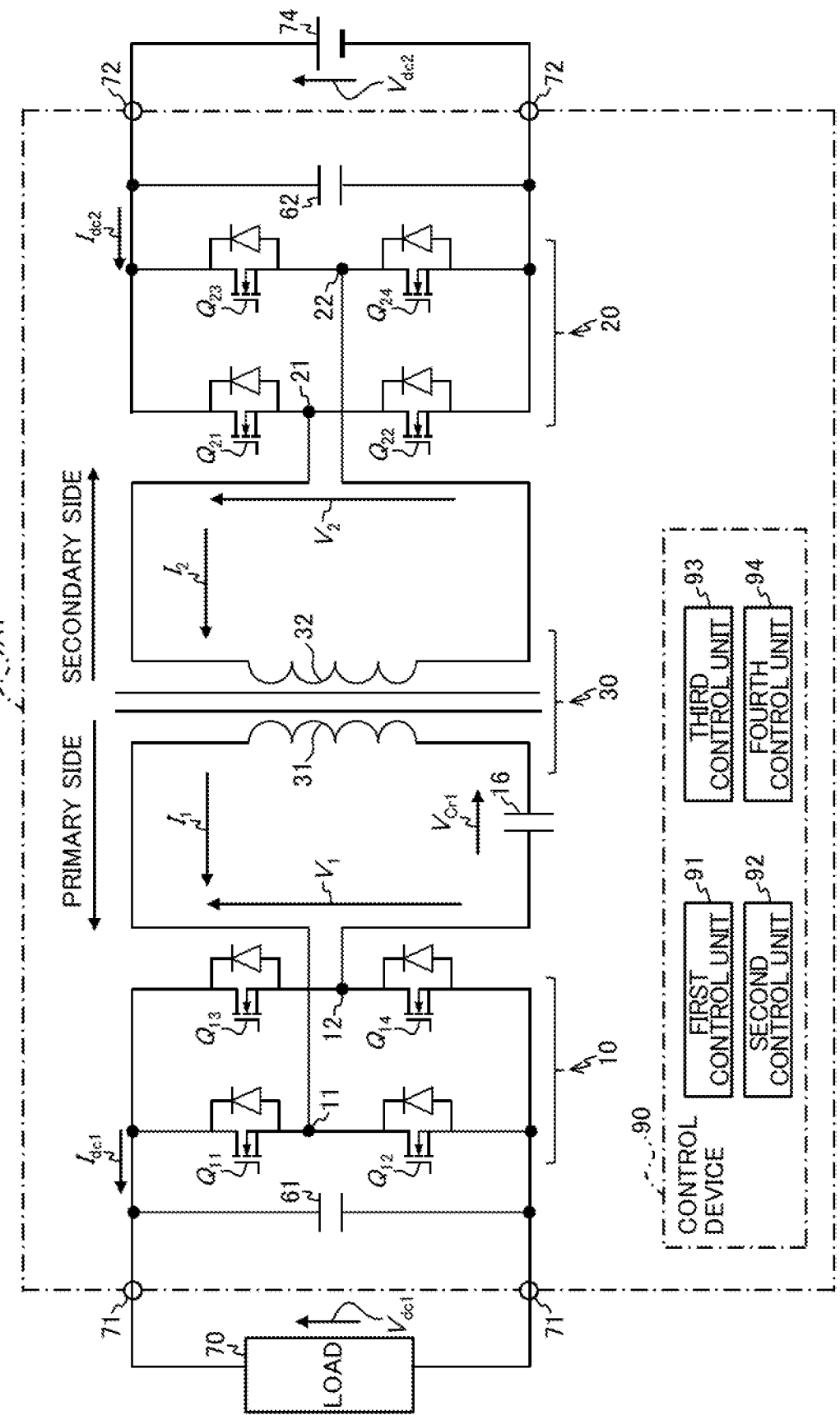
FIG. 1 is a circuit diagram/a block diagram of a power conversion device according to a first embodiment of the present invention.

FIG. 1 is a circuit diagram/a block diagram of the power conversion device A1.

The power conversion device A1 includes a pair of primary side terminals 71 connected to an external load 70 (a first DC system), a pair of secondary side terminals 72 connected to an external DC voltage source 74 (a second DC system), a capacitor 61 connected between the pair of primary side terminals 71, a capacitor 62 connected between the pair of secondary side terminals 72, a primary side bridge circuit 10, a secondary side bridge circuit 20, a transformer 30, and a control device 90 (a power conversion device control device).

The transformer 30 includes a primary winding 31 (a first winding) and a secondary winding 32 (a second winding). The primary side bridge circuit 10 is connected between the primary winding 31 and the capacitor 61. The secondary side bridge circuit 20 is connected between the secondary winding 32 and the capacitor 62. The primary side bridge circuit 10 includes switching elements $Q_{11}$ to $Q_{24}$ (first to fourth switching elements). The secondary side bridge circuit 20 includes switching elements $Q_{21}$ to $Q_{24}$ (fifth to eighth switching elements). In this embodiment, a MOSFET (Metal-Oxide-Semiconductor Field-Effect Transistor) is applied as these switching elements.

The switching elements $Q_{11}$ and $Q_{12}$ included in the primary side bridge circuit 10 are connected in series between the pair of primary side terminals 71. A connection point 11 (a first connection point) of the switching elements $Q_{11}$ and $Q_{12}$ is connected to one end of the primary winding 31 of the transformer 30. The switching elements $Q_{13}$ and $Q_{14}$ are connected in series between the pair of primary side terminals 71. A connection point 12 (a second connection point) of the switching elements $Q_{13}$ and $Q_{14}$ is connected to the other end of the primary winding 31 via a resonance capacitor 16.

The switching elements $Q_{21}$ and $Q_{22}$ included in the secondary side bridge circuit 20 are connected in series between the pair of secondary side terminals 72. A connection point 21 (a third connection point) of the switching elements $Q_{21}$ and $Q_{22}$ is connected to one end of the secondary winding 32 of the transformer 30. The switching elements $Q_{23}$ and $Q_{24}$ are also connected in series between the pair of secondary side terminals 72. A connection point 22 (a fourth connection point) of the switching elements $Q_{23}$ and $Q_{24}$ is connected to the other end of the secondary winding 32.

A terminal voltage of the load 70 is referred to as primary side DC voltage $V_{dc1}$ (first DC voltage). A terminal voltage of the DC voltage source 74 is referred to as secondary side DC voltage $V_{dc2}$ (second DC voltage). A voltage between the connection points 11 and 12 in the primary side bridge circuit 10 is referred to as primary side AC voltage $V_1$ (first voltage). A voltage between the connection points 21 and 22 in the secondary side bridge circuit 20 is referred to as secondary side AC voltage $V_2$ (second voltage). An electric current flowing from the primary winding 31 toward the connection point 11 in the primary side bridge circuit 10 is referred to as primary side AC current $I_1$ (first current). An electric current flowing from the primary side bridge circuit 10 toward the load 70 is referred to as primary side DC current $I_{dc1}$.

An electric current flowing from the connection point 21 in the secondary side bridge circuit 20 toward the secondary winding 32 is referred to as secondary side AC current $I_2$ (second current). An electric current flowing from the DC voltage source 74 toward the secondary side bridge circuit 20 is referred to as secondary side DC current $I_{dc2}$. A terminal voltage of the resonance capacitor 16 is referred to as resonance capacitor voltage $V_{Cr1}$. Concerning all the voltages and all the electric currents, a direction of arrows shown in FIG. 1 is "positive" and the opposite direction of the direction is "negative".

The control device 90 includes hardware of a general computer such as a CPU (Central Processing Unit), a RAM (Random Access Memory), and a ROM (Read Only Memory). A control program executed by the CPU, various data, and the like are stored in the ROM. The control device 90 controls the bridge circuits 10 and 20 according to the control program, the various data, and the like. In FIG. 1, on the inside of the control device 90, functions realized by the control program and the like are shown as blocks.

That is, the control device 90 includes a first control unit 91, a second control unit 92, a third control unit 93, and a fourth control unit 94. The first to fourth control units 91 to 94 switch levels of control signals $S_{11}$ to $S_{14}$ and $S_{21}$ to $S_{24}$ as appropriate to thereby switch ON/OFF states of the switching elements $Q_{11}$ to $Q_{14}$ and $Q_{21}$ to $Q_{24}$. Note that details of the operation of the first to fourth control units 91 to 94 are explained below.

Note that, in an example shown in FIG. 1, the load 70 is disposed on the primary side of the transformer 30 and the DC voltage source 74 is disposed on the secondary side. Therefore, a direction of a power flow is a flowing direction from the secondary side to the primary side. However, the power conversion device A1 can set the direction of the power flow to a direction from the primary side to the secondary side. It is possible to interchange electric power in both directions between the primary side and the secondary side.

Figure 2:
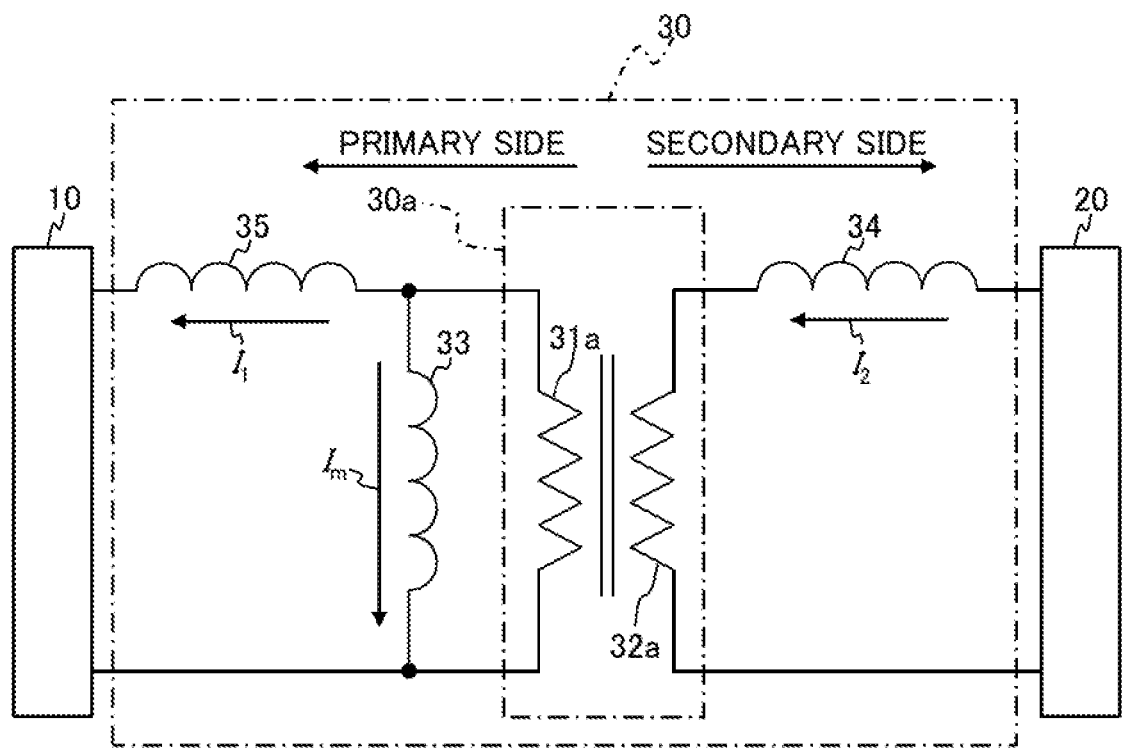

FIG. 2 is an equivalent circuit diagram of the transformer 30 and the like.

As shown in the figure, the transformer 30 can be considered as a transformer including an ideal transformer 30a without a leak magnetic flux, an excitation inductance 33 connected in parallel to a primary winding 31a of the ideal transformer 30a, a leakage inductance 35 connected between the excitation inductance 33 and the primary side bridge circuit 10, and a leakage inductance 34 connected in series to a secondary winding 32a of the ideal transformer 30a.

<Operation in the First Embodiment>
(Operation of the Bridge Circuit)

In the primary side bridge circuit 10 shown in FIG. 1, a state where the switching elements $Q_{11}$ and $Q_{14}$ are on and the switching elements $Q_{12}$ and $Q_{13}$ are off and a state where the switching elements $Q_{11}$ and $Q_{14}$ are off and the switching elements $Q_{12}$ and $Q_{13}$ are on are sometimes complementarily switched.

Figure 3:
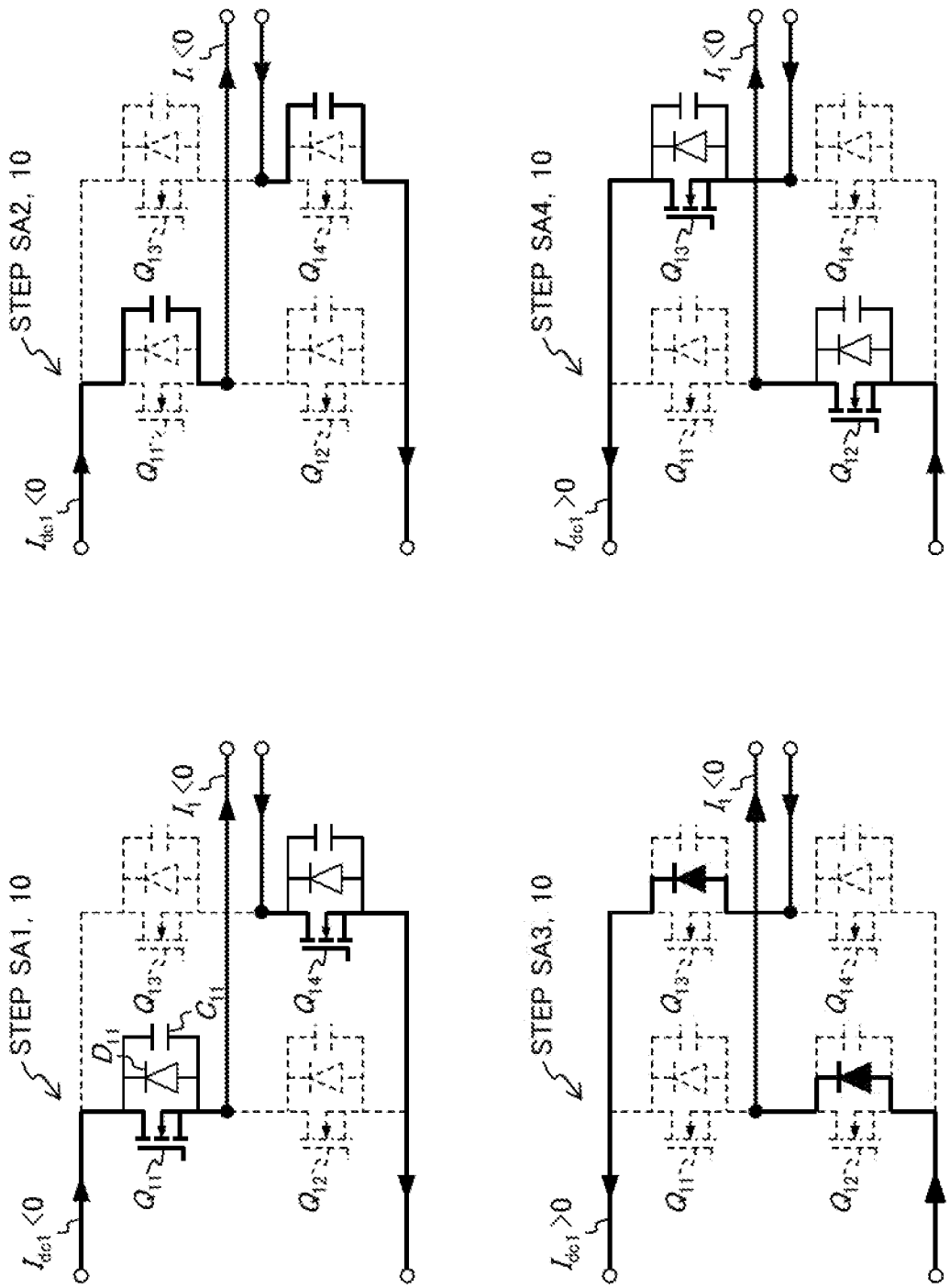
FIG. 3 is an explanatory diagram of a switching operation of a switching element.
Figure 4:
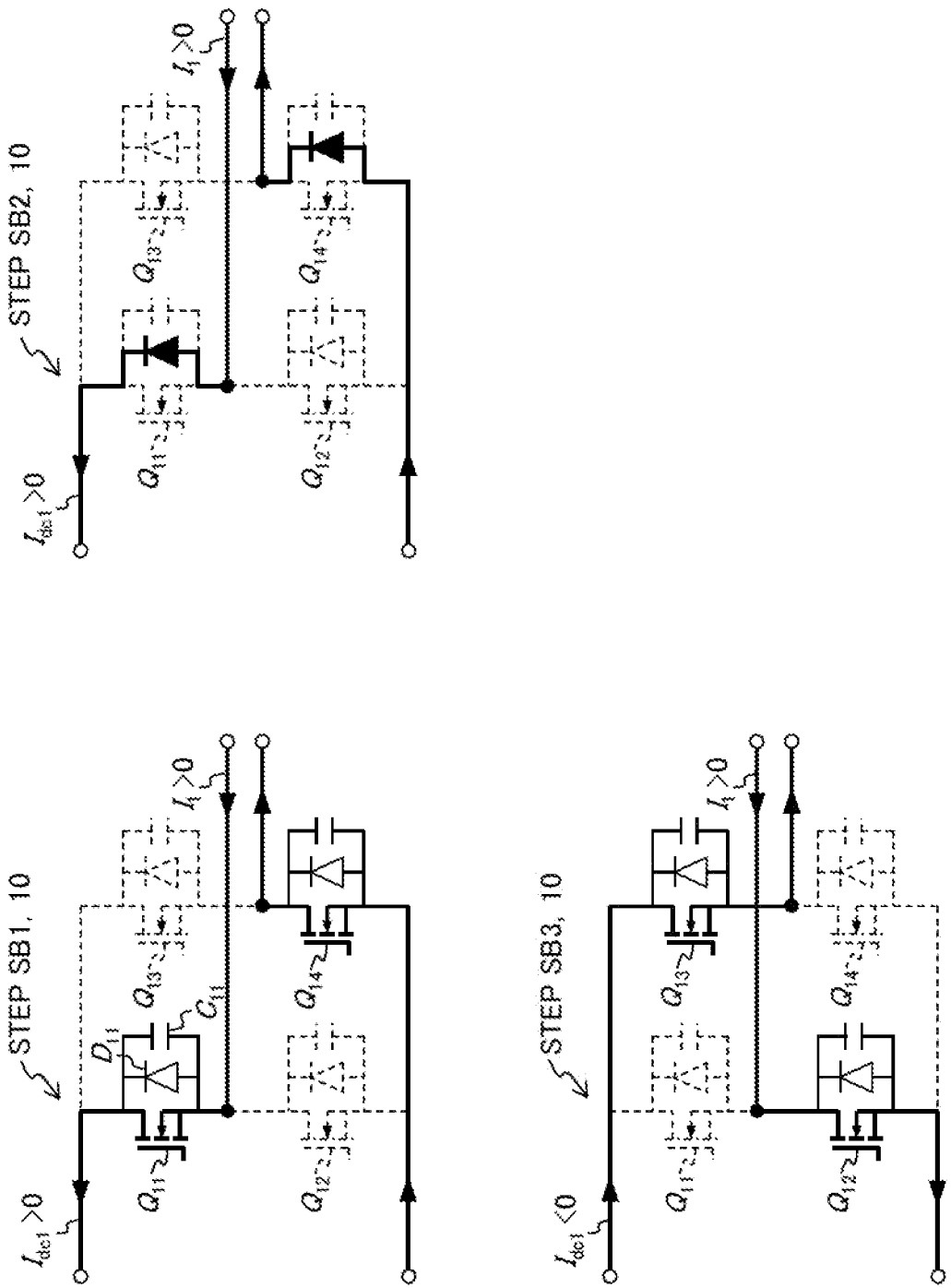
FIG. 4 is an explanatory diagram of another switching operation of the switching element.

FIG. 3 and FIG. 4 are diagrams for explaining details of a switching operation of these switching elements.

In these figures, when the switching elements $Q_{11}$ to $Q_{14}$ are represented by solid lines, this means that the control signals $S_{11}$ to $S_{14}$ corresponding to the switching elements $Q_{11}$ to $Q_{14}$ are at an H level and the switching elements $Q_{11}$ to $Q_{14}$ are in the ON state. On the other hand, when the switching elements $Q_{11}$ and $Q_{14}$ are represented by broken lines, this indicates that the control signals $S_{11}$ to $S_{14}$ corresponding to the switching elements $Q_{11}$ and $Q_{14}$ are at an L level (0 V) and the switching elements $Q_{11}$ and $Q_{14}$ are in the OFF state.

In FIG. 3 and FIG. 4, the switching elements $Q_{11}$ to $Q_{14}$ of the primary side bridge circuit 10 include parasitic diodes and parasitic capacitors. In the switching element $Q_{11}$ in step SA1 of FIG. 3, the parasitic diode is denoted by a sign $D_{11}$ and the parasitic capacitor is denoted by a sign $C_{11}$. To avoid complication of the figures, signs of the parasitic diodes and the parasitic capacitors in the other portions are not shown. However, in the following explanation, the parasitic diodes and the parasitic capacitors of the switching elements $Q_{11}$ to $Q_{14}$ are represented as "parasitic diodes $D_{11}$ to $D_{14}$" and "parasitic capacitors $C_{11}$ to $C_{14}$" using the same suffixes.

In step SA1 in FIG. 3, the switching elements $Q_{11}$ and $Q_{14}$ are on and the switching elements $Q_{12}$ and $Q_{13}$ are off. A direction of the primary side AC current $I_1$ flowing to the switching elements $Q_{11}$ and $Q_{14}$ is indicated by an arrow. This direction is opposite to the direction of the primary side AC current $I_1$ shown in FIG. 1. Therefore, the polarity of the primary side AC current $I_1$ in step SA 1 is "negative".

In a state of step SA1, when the switching elements $Q_{11}$ and $Q_{14}$ are turned off, all the switching elements $Q_{11}$ to $Q_{14}$ are switched to the OFF state and a state of the primary side bridge circuit 10 transitions to step SA2. In step SA2, the electric current $I_1$ in the same direction as the direction in step SA1 continues to flow via the parasitic capacitors $C_{11}$ and $C_{14}$ with an inductance component of the primary winding 31 (see FIG. 1). Then, the parasitic capacitors $C_{11}$ and $C_{14}$ are charged to set a cathode side of the parasitic diodes $D_{11}$ and $D_{14}$ to positive and set an anode side of the parasitic diodes $D_{11}$ and $D_{14}$ to negative. The potential of the first connection point 11 decreases and the potential of the second connection point 12 increases. The charges of the parasitic capacitors $C_{12}$ and $C_{13}$ are discharged by the changes in the potentials.

Thereafter, when the parasitic capacitors $C_{12}$ and $C_{13}$ are further discharged, an anode potential with respect to a cathode potential of the parasitic diodes $D_{12}$ and $D_{13}$ becomes higher than a forward direction voltage drop (e.g., 0.6 V). The parasitic diodes $D_{12}$ and $D_{13}$ conduct. That is, as shown in step SA3, the primary side AC current $I_1$ flows via the parasitic diodes $D_{12}$ and $D_{13}$.

When the switching elements $Q_{12}$ and $Q_{13}$ are turned on in a state of step SA3, the electric current $I_1$ flowing to the parasitic diodes $D_{12}$ and $D_{13}$ flows via the switching elements $Q_{12}$ and $Q_{13}$. That is, the electric current $I_1$ flows as shown in step SA4. This is because a voltage drop of the switching elements $Q_{12}$ and $Q_{13}$ is lower than a forward direction voltage drop of the parasitic diodes $D_{12}$ and $D_{13}$.

In steps SA1 and SA2, a drain-source voltage of the switching elements $Q_{12}$ and $Q_{13}$ has a relatively high value. However, in step SA3, the drain-source voltage has a value close to 0 (e.g., 0.6 V). A drain current of the switching elements $Q_{12}$ and $Q_{13}$ is nearly 0 in steps SA1 to SA3 and greatly rises in transition from step SA3 to step SA4. A switching loss is a value obtained by integrating a product of the drain-source voltage and the drain current. However, at least one of the drain-source voltage and the drain current is nearly 0 in processes of all steps SA1 to SA4. Therefore, the switching loss is an extremely small value close to 0.

In the state where "the switching elements $Q_{11}$ and $Q_{14}$ are on and the primary side AC current $I_1$ has a negative value" (step SA1) as explained above, the complementary switching of the ON/OFF states of the switching elements $Q_{11}$ to $Q_{14}$ (switching to the state of step SA4) can be realized with an extremely small loss by so-called soft switching.

When step SB1 in FIG. 4 is compared with step SA1 in FIG. 3, the ON/OFF states of the switching elements $Q_{11}$ to $Q_{14}$ are the same but the direction of the primary side AC current $I_1$ is opposite. That is, in step SB1, the polarity of the primary side AC current $I_1$ is "positive".

When the switching elements $Q_{11}$ and $Q_{14}$ are turned off in the state of step SB1, all the switching elements $Q_{11}$ to $Q_{14}$ are switched to the OFF state and the state of the primary side bridge circuit 10 transitions to step SB2. That is, the electric current $I_1$ in the same "positive" direction as the direction in step SA1 continues to flow via the parasitic diodes $D_{11}$ and $D_{14}$ with the inductance component of the primary winding 31 (see FIG. 1).

When the switching elements $Q_{12}$ and $Q_{13}$ are turned on in this state, the primary side AC current $I_1$ flows to the switching elements $Q_{12}$ and $Q_{13}$. The charges of the parasitic capacitors $C_{12}$ and $C_{13}$ are simultaneously discharged. When the state transitions from step SB2 to step SB3, a period in which the drain-source voltage of the switching elements $Q_{12}$ and $Q_{13}$ transitions from a positive value to zero and a period in which the drain current transitions from zero to a positive value overlap. Therefore, electric power equivalent to "drain-source voltage×drain current" is consumed. That is, a switching loss is caused by hard switching.

In the state where "the switching elements $Q_{11}$ and $Q_{14}$ are on and the primary side AC current $I_1$ has a positive value" (step SB1) as explained above, when the ON/OFF states of the switching elements $Q_{11}$ to $Q_{14}$ are complementarily switched (switched to the state of step SB3), a switching loss is caused by hard switching.

In the above explanation concerning FIG. 3 and FIG. 4, the switching elements $Q_{11}$ and $Q_{14}$ are on in the initial state (steps SA1 and SB1). Conversely, if the switching elements $Q_{12}$ and $Q_{13}$ are on in the initial state, the direction of the primary side AC current $I_1$ is reversed. That is, if the primary side AC current $I_1$ has a positive value in the initial state, the ON/OFF states of the switching elements $Q_{11}$ to $Q_{14}$ can be complementarily switched by the soft switching. On the other hand, if the primary side AC current $I_1$ has a negative value in the initial state, when the ON/OFF states of the switching elements $Q_{11}$ to $Q_{14}$ are complementarily switched, a switching loss is caused by the hard switching.

In the example explained above, as the parasitic diodes $D_{11}$ to $D_{14}$ and the parasitic capacitors $C_{11}$ to $C_{14}$, the parasitic diodes and the parasitic capacitors originally included in the switching elements $Q_{11}$ to $Q_{14}$ are applied. However, separate diodes or capacitors may be connected in parallel to the switching elements $Q_{11}$ to $Q_{14}$. The operation of the secondary side bridge circuit 20 is the same as the operation of the primary side bridge circuit 10 explained above.

(Overall Operation)

Figure 5:
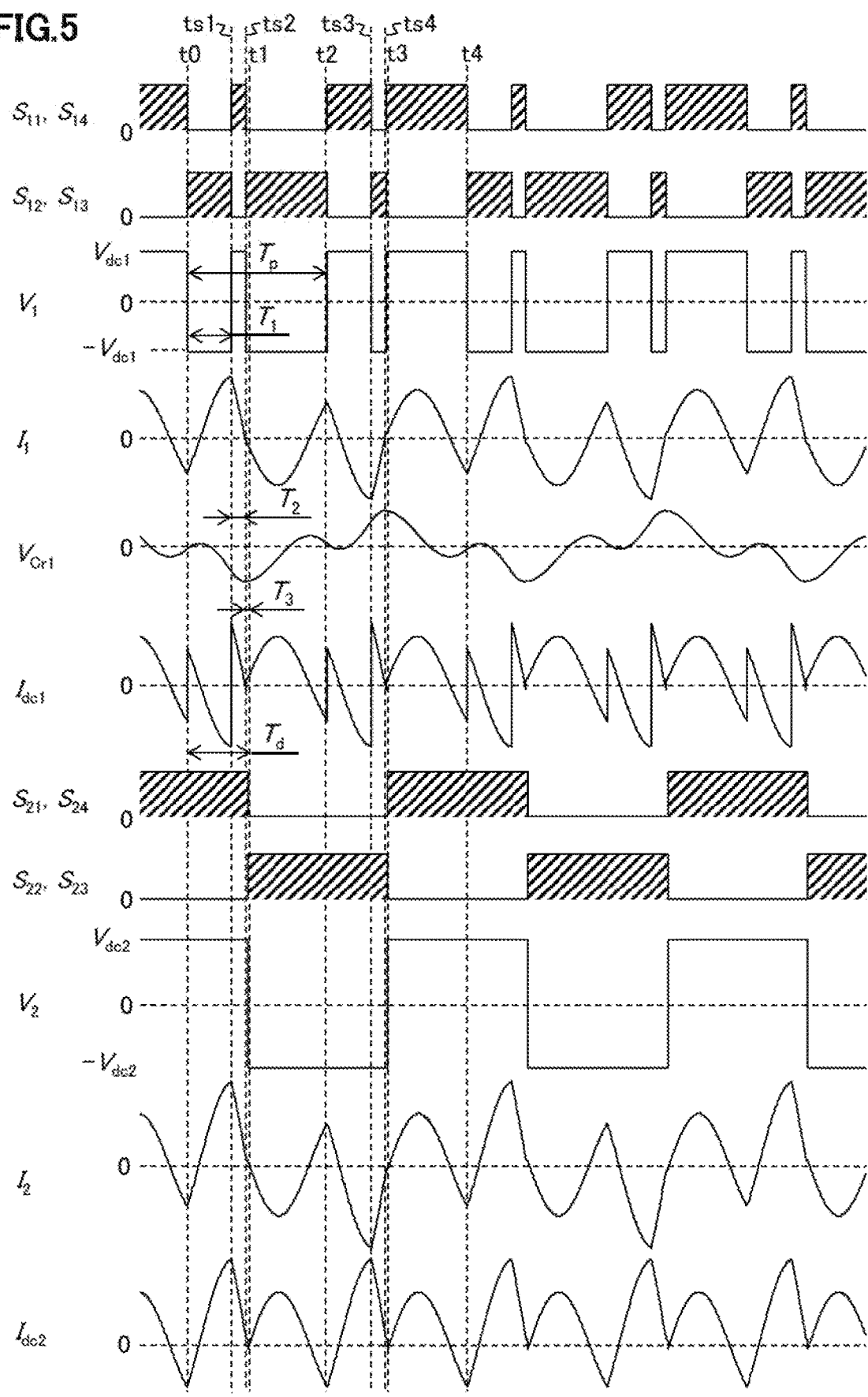
FIG. 5 is a waveform chart of units in the first embodiment.

FIG. 5 is a waveform chart of the units in the power conversion device A1.

At time t0 in FIG. 5, the first control unit 91 (see FIG. 1) lowers the control signals $S_{11}$ and $S_{14}$ to the L level and raises the control signals $S_{12}$ and $S_{13}$ to the H level. However, timings of the lowering and the raising are not strictly the same. That is, as shown in step SA2 and SA3 in FIG. 3 and step SB2 in FIG. 4, a period in which the first control unit 91 supplies the control signals $S_{11}$ to $S_{14}$ at the L level to all the switching elements $Q_{11}$ to $Q_{14}$ in the primary side bridge circuit 10 and switches all the switching elements $Q_{11}$ to $Q_{14}$ to the OFF state is always present.

To avoid complication of explanation, explanation of this point is omitted below. However, a period in which all the switching elements in the primary side bridge circuit 10 or the secondary side bridge circuit 20 are turned off is also provided at other timings when the levels of the control signals $S_{11}$ to $S_{14}$ and $S_{21}$ to $S_{24}$ are complementarily switched. In FIG. 5, periods in which the control signals $S_{11}$ to $S_{14}$ and $S_{21}$ to $S_{24}$ are at the H level, that is, periods in which the switching elements $Q_{11}$ to $Q_{14}$ and $Q_{21}$ to $Q_{24}$ corresponding to the control signals $S_{11}$ to $S_{14}$ and $S_{21}$ to $S_{24}$ are in the ON state are indicated by hatching.

The third control unit 93 (see FIG. 1) lowers the control signals $S_{21}$ and $S_{24}$ to the L level and raises the control signals $S_{22}$ and $S_{23}$ to the H level at time t1. Thereafter, the third control unit 93 complementarily switches the H/L levels of the control signals $S_{21}$ to $S_{24}$ in every half cycle $T_p$. Consequently, the levels of the control signals $S_{21}$ to $S_{24}$ repeat the same pattern in the cycles of $2 \cdot T_p$.

In the control signals $S_{11}$ to $S_{14}$, a period called "slit period $T_2$" is provided in a period of the half cycle $T_p$. That is, the second control unit 92 (see FIG. 1) reverses the H/L levels of the control signals $S_{11}$ to $S_{14}$ at time ts1 when the slit period $T_2$ begins. At time ts2 when the slid period $T_2$ ends, the fourth control unit 94 reverses the H/L levels of the control signals $S_{11}$ to $S_{14}$ and returns the H/L levels to a state before time ts1.

The second control unit 92 reverses the H/L levels of the control signals $S_{11}$ to $S_{14}$ at time ts3 when the half cycle $T_p$ elapses from time ts1. Similarly, the fourth control unit 94 reverses the H/L levels of the control signals $S_{11}$ to $S_{14}$ at time ts4 when the half cycle $T_p$ elapses from time ts2. The H/L levels of the control signals $S_{11}$ to $S_{14}$ set at time ts4 continues to time t4 afterward. Thereafter, the H/L levels of the control signals $S_{11}$ to $S_{14}$ repeat the same pattern as the pattern at time t0 to t4 in the cycles of $2 \cdot T_p$.

Operation based on the control signals $S_{11}$ to $S_{14}$ and $S_{21}$ to $S_{24}$ is explained in detail.

At time t0 described above, the primary side AC current $I_1$ is lower than 0 and has a negative value. Therefore, the complementary switching of the H/L levels of the control signals $S_{11}$ to $S_{14}$ from the state where the control signals $S_{11}$ and $S_{14}$ are at the H level can be realized by the soft switching (see FIG. 3). Thereafter, the primary side AC voltage $V_1$ is retained at $-V_{dc1}$ until a predetermined period $T_1$ (a first predetermined period) elapses. Consequently, in this period, the primary side AC current $I_1$ gradually increases. The secondary side AC current $I_2$ increases substantially proportional to the primary side AC current $I_1$. Note that a determination method for the predetermined period $T_1$ is explained below.

At time ts1 when the predetermined period $T_1$ elapses from time t0, a slit period $T_2$ (a second predetermined period) is started. That is, the second control unit 92 complementarily switches the H/L levels of the control signals $S_{11}$ to $S_{14}$. At time ts1, the primary side AC current $I_1$ has a positive value. Therefore, the complementary switching of the levels of the control signals $S_{11}$ to $S_{14}$ from the state where the control signals $S_{12}$ and $S_{13}$ are at the H level can also be realized by the soft switching.

The polarity of the primary side AC voltage $V_1$ is reversed at time ts1. The primary side AC current $I_1$ and the secondary side AC current $I_2$ start to decrease. At time ts2 when the slit period $T_2$ ends, the primary side AC current $I_1$ is lower than 0 and has a negative value. That is, timing when the primary side AC current $I_1$ is lower than 0 is determined as the slit period $T_2$ on the basis of a circuit constant, an experiment result, and the like. More specifically, the slit period $T_2$ is calculated or stored by the fourth control unit 94.

The primary side AC current $I_1$ has a negative value at time ts2 when the slit period $T_2$ ends. At time ts2, the fourth control unit 94 complementarily switches the levels of the control signals $S_{11}$ to $S_{14}$ from the state where the control signals $S_{11}$ and $S_{14}$ are at the H level. Therefore, such switching can also be realized by the soft switching.

Incidentally, the secondary side AC current $I_2$ is substantially proportional to the primary-side AC current $I_1$. However, response of the secondary side AC current $I_2$ is slightly slow compared with the primary side AC current $I_1$. This is because the transformer 30 includes delay elements equivalent to the inductances 33 to 35 as shown in the equivalent circuit in FIG. 2. More specifically, behaviors of $I_1$ and $I_2$ are different depending on an excitation current flowing to the excitation inductance 33. Therefore, in an example shown in FIG. 5, at time ts2, the primary side AC current $I_1$ has a negative value but the secondary side AC current $I_2$ has a positive value. Further, the secondary side AC current $I_2$ maintains the positive value at time t1 when a slight predetermined period $T_3$ elapses from time ts2.

The third control unit 93 (see FIG. 1) complementarily switches the H/L levels of the control signals $S_{21}$ to $S_{24}$ at timing of time t1. At time t1, the secondary side AC current $I_2$ has a positive value. Therefore, when the H/L levels of the control signals $S_{21}$ to $S_{24}$ are complementarily switched from the state where the control signals $S_{21}$ and $S_{24}$ are at the H level, such switching can also be realized by the soft switching.

When the levels of the control signals $S_{21}$ to $S_{24}$ are complementarily switched at time t1, the polarity of the secondary side AC voltage $V_2$ is reversed. Consequently, the primary side and secondary side AC currents $I_1$ and $I_2$ decrease (absolute values increase). However, as shown in FIG. 1, the resonance capacitor 16 is connected in series to the primary winding 31 of the transformer 30. At time t1, charges are accumulated in a state where a voltage $V_{Cr1}$ of the resonance capacitor 16 is negative. The resonance capacitor 16 is discharged by the primary side AC current $I_1$. The absolute value of the resonance capacitor voltage $V_{Cr1}$ decreases. A voltage applied to the primary winding 31 of the transformer 30 changes. Consequently, the primary side and secondary side AC currents $I_1$ and $I_2$ increase (absolute values decrease).

At time t2, the primary side AC current $I_1$ is larger than 0. Therefore, at time t2, the first control unit 91 complementarily switches the levels of the control signals $S_{11}$ to $S_{14}$. In other words, timing when the primary side AC current $I_1$ exceeds 0 at time t0 and subsequent time is determined as the half cycle $T_p$ on the basis of a circuit constant, an experiment result, and the like. More specifically, the half cycle $T_p$ is calculated or stored by the first to fourth control units 91 to 94.

A period from time t0 when the levels of the control signals $S_{11}$ to $S_{14}$ are complementarily switched to time t1 when the levels of the control signals $S_{21}$ to $S_{24}$ are complementarily switched is represented as $I_d$. When the cycle $2 \cdot T_p$ is set to 360°, an angle corresponding to the period $T_d$ is referred to as phase difference δ. The phase difference δ is determined according to a voltage ratio $\alpha = V_{dc1}/V_{dc2}$. For example, when the voltage ratio α is monotonously increased in a range of 2 to 7 or 3 to 6 at a certain circuit constant, the phase difference δ monotonously increases in a range of 45° to 120° (⅛ to ⅓ of the cycle $2 \cdot T_p$) or 60° to 90° (⅙ to ¼ of the cycle $2 \cdot T_p$).

A determination method for the predetermined period $T_1$ described above is explained. As explained above, the half cycle $T_p$, the slit period $T_2$, and the predetermined period $T_3$ are determined by the circuit constant and the like. The phase difference δ is determined by the voltage ratio α. When the half cycle $T_p$ and the phase difference δ are determined, the period $T_d$ is also determined. Therefore, the predetermined period $T_1$ is a value obtained by subtracting the slit period $T_2$ and the predetermined period $T_3$ from the determined period $T_d$.

The operation in the period of times t0 to t2 is explained above. However, the operation at times t2 to t4 is the same as the operation at times t0 to t2 except that the levels of the control signals $S_{11}$ to $S_{14}$ and $S_{21}$ to $S_{24}$ are reversed and that the polarities of the voltages and the electric currents of the units are reversed. Thereafter, the same operation as the operation at times t0 to t4 is repeated in every cycle $2 \cdot T_p$.

In the operation shown in FIG. 5, the soft switching is realized at the switching timings of the levels of the control signals $S_{11}$ to $S_{14}$ and $S_{21}$ to $S_{24}$. However, the soft switching does not always have to be realized at these timings. That is, a switching loss can be reduced to relatively small even by the hard switching if the absolute values of the primary side and secondary side AC currents $I_1$ and $I_2$ are within ranges of 1/10 or less of peak values of the primary side and secondary side AC currents $I_1$ and $I_2$. Therefore, the hard switching may be performed when the absolute values of the primary side and secondary side AC currents $I_1$ and $I_2$ are within the ranges of 1/10 or less of the peak values of the primary side and secondary side AC currents $I_1$ and $I_2$.

Comparative Example

A comparative example is explained in order to clarify effects of this embodiment. First, a hardware configuration in the comparative example is the same as the hardware configuration in the first embodiment (FIG. 1). However, the comparative example is different from the first embodiment in that a period equivalent to the slit period $T_2$ (see FIG. 5) is not provided.

Figure 6:
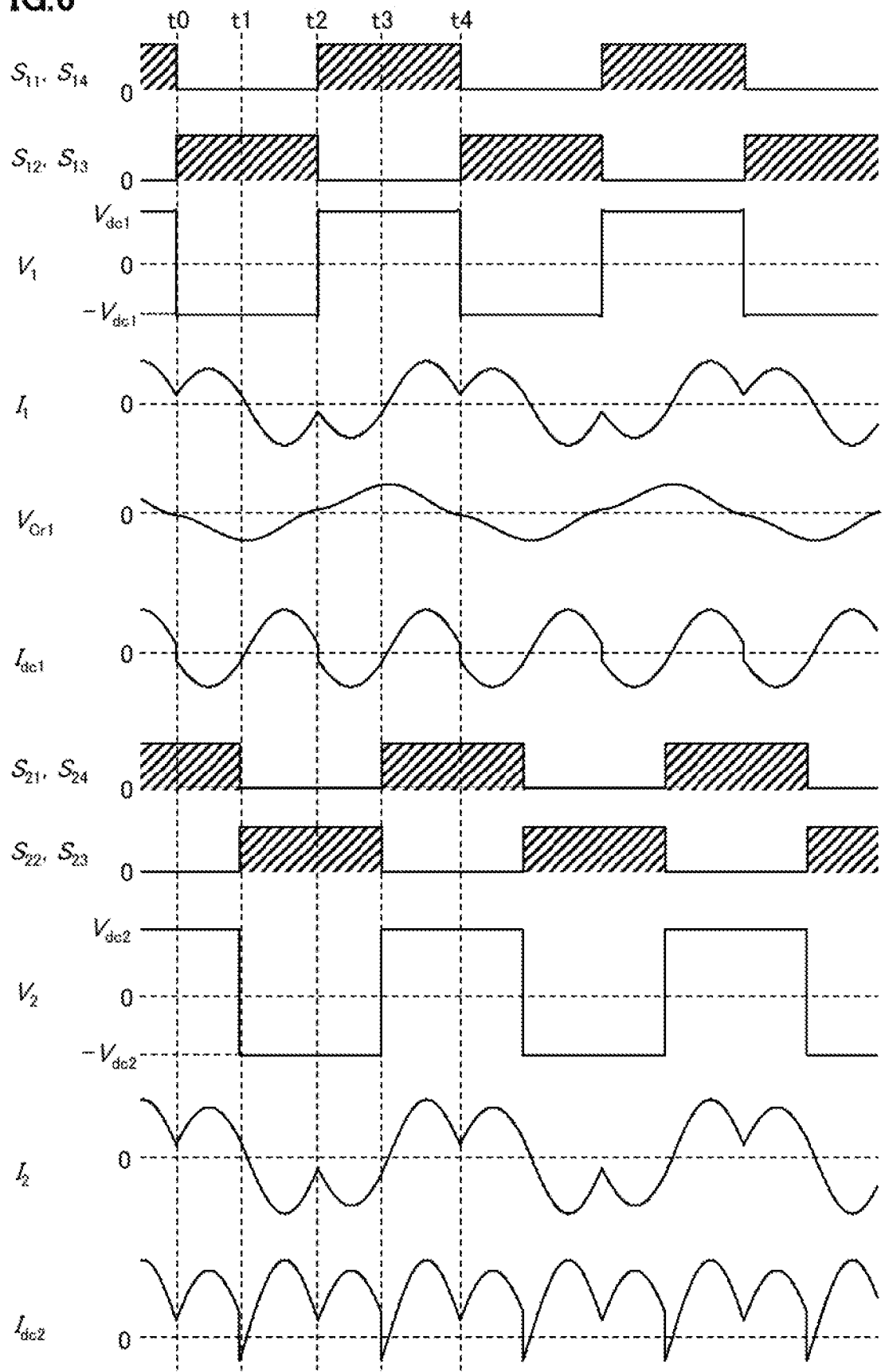
FIG. 6 is a waveform chart of the units in a comparative example.

FIG. 6 is a waveform chart of the units in the comparative example.

At time t0 in FIG. 6, the levels of the control signals $S_{11}$ to $S_{14}$ are complementarily switched from the state where the control signals $S_{11}$ and $S_{14}$ are at the H level. However, at time to, since the primary side AC current $I_1$ has a positive value, such switching is the hard switching.

At time t1, the levels of the control signals $S_{21}$ to $S_{24}$ are complementarily switched from the state where the control signals $S_{21}$ and $S_{24}$ are at the H level. At time t1, since the secondary side AC current $I_2$ has a positive value, such switching is the soft switching.

At time t2 and subsequent time, the switching of the control signals $S_{11}$ to $S_{14}$ is the hard switching. Therefore, it is seen that, compared with the first embodiment, this comparative example is disadvantageous in that a switching loss is large, energy efficiency is inferior, and a cooling device (not shown in the figure) that cools the switching elements $Q_{11}$ to $Q_{14}$ and $Q_{21}$ to $Q_{24}$ and the like is increased in size.

<Effects of the Embodiment>

As explained above, according to this embodiment, the control device (90) includes the first control unit (91) that repeats (times t0 and t4), in every predetermined cycle $(2 \cdot T_p)$ in the state where the second and third switching elements ($Q_{12}$ and $Q_{13}$) are in the OFF state and the absolute value of the first current ($I_1$) is equal to or smaller than 1/10 of the peak value of the first current ($I_1$), an operation including causing the positive electrode of the first voltage ($V_1$) to appear at the second connection point (12) (setting $V_1$ to a negative value) by switching the second and third switching elements ($Q_{12}$ and $Q_{13}$) to the ON state, the second control unit (92) that repeats (time ts1), in the every cycle $(2 \cdot T_p)$ when the first predetermined period ($T_1$) elapses (time ts1) after the first control unit (91) operates (after time t0), an operation including causing the positive electrode of the first voltage ($V_1$) to appear at the first connection point (11) (setting $V_1$ to a positive value) by switching the second and third switching elements ($Q_{12}$ and $Q_{13}$) to the OFF state, and the third control unit (93) that repeats (time t1), in the every cycle $(2 \cdot T_p)$ in the state where the absolute value of the second current ($I_2$) is equal to or smaller than 1/10 of the peak value of the second current ($I_2$) after the second control unit (92) operates (after time ts1) and after the positive electrode of the first voltage ($V_1$) appears at the second connection point (12) ($V_1$ has a negative value at time ts2), an operation including switching the fifth and eighth switching elements ($Q_{22}$ and $Q_{23}$) to the OFF state and switching the sixth and seventh switching elements ($Q_{22}$ and $Q_{23}$) to the ON state.

Consequently, it is easy to realize the soft switching and reduce the switching loss.

According to this embodiment, by setting an appropriate voltage ratio, it is easier to realize the soft switching. It is possible to further reduce the switching loss.

According to this embodiment, by setting an appropriate phase difference, it is easier to realize the soft switching. It is possible to further reduce the switching loss.

According to this embodiment, the first control unit (91) switches the first and fourth switching elements ($Q_{11}$ and $Q_{14}$) to the OFF state when switching the second and third switching elements ($Q_{12}$ and $Q_{13}$) to the ON state. The second control unit (92) switches the first and fourth switching elements ($Q_{11}$ and $Q_{14}$) to the ON state when switching the second and third switching elements ($Q_{12}$ and $Q_{13}$) to the OFF state. The control device (90) further includes the fourth control unit (94) that switches the first and fourth switching elements ($Q_{11}$ and $Q_{14}$) to the OFF state and switches the second and third switching elements ($Q_{12}$ and $Q_{13}$) to the ON state when the second predetermined period ($T_2$) elapses (time ts2) after the second control unit (92) operates (after time ts1).

In this way, the fourth control unit (94) appropriately controls the ON/OFF states of the first to fourth switching elements ($Q_{11}$ to $Q_{14}$). Consequently, it is easier to realize the soft switching. It is possible to further reduce the switching loss.

According to this embodiment, the third control unit (93) switches the fifth and eighth switching elements ($Q_{21}$ and $Q_{24}$) to the OFF state and switches the sixth and seventh switching elements ($Q_{22}$ and $Q_{23}$) to the ON state when the third predetermined period $T_3$) elapses after the fourth control unit (94) operates.

Consequently, it is possible to compensate for a delay element of the transformer (30) and switch the ON/OFF states of the fifth and eighth switching elements ($S_{21}$ and $S_{24}$) at appropriate timings. Therefore, it is easier to realize the soft switching. It is possible to further reduce the switching loss.

Second Embodiment

<Configuration and Operation in a Second Embodiment>

The configuration of a power conversion device A2 according to a second embodiment of the present invention is explained.

Figure 7:
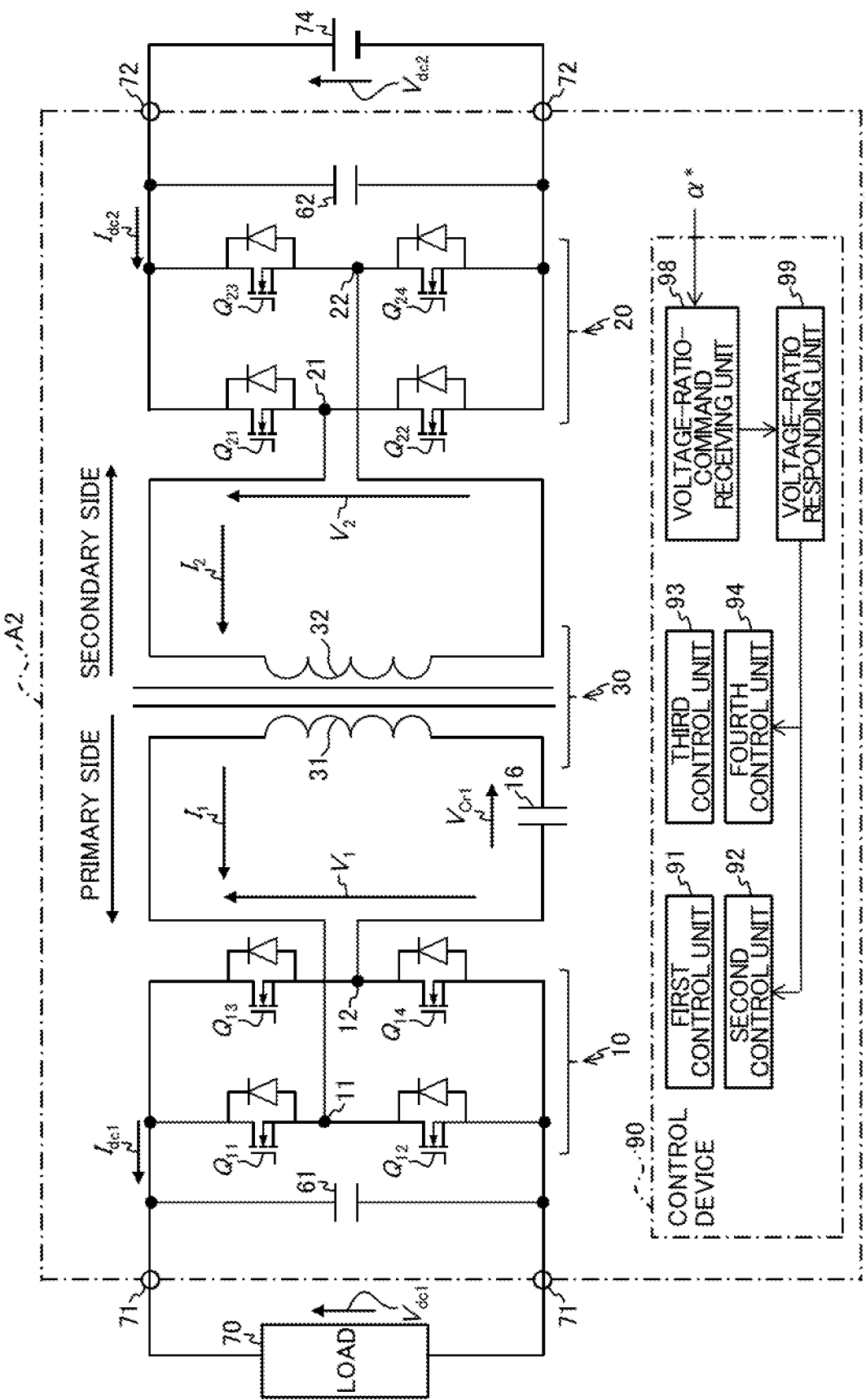
FIG. 7 is a circuit diagram/a block diagram of a power conversion device according to a second embodiment of the present invention.

FIG. 7 is a block diagram of the power conversion device A2.

Note that, in FIG. 7, portions corresponding to the units shown in FIG. 1 to FIG. 6 are denoted by the same reference numerals and signs. Explanation of the portions is sometimes omitted.

A hardware configuration of the power conversion device A2 is the same as the hardware configuration of the power conversion device A1 in the first embodiment. However, the second embodiment is different from the first embodiment in that the control device 90 includes a voltage-ratio-command-value receiving unit 98 and a voltage-ratio responding unit 99.

Two operation modes MD1 and MD2 are present in this embodiment.

The operation mode MD1 is an operation mode in which the slit period $T_2$ is not provided as in the comparative example (see FIG. 6) explained above. On the other hand, in the operation mode MD2, the primary side and secondary side bridge circuits 10 and 20 are operated as in the first embodiment. The operation mode MD2 is an operation mode in which the slit period $T_2$ is provided as shown in FIG. 5.

The voltage-ratio-command-value receiving unit 98 receives a voltage ratio command value α*, which is a command value of the voltage ratio α, from an external host device (not shown in the figure). The voltage-ratio responding unit 99 determines whether the voltage ratio command value α* is equal to or smaller than a predetermined threshold αth. If a result of the determination is affirmative, the voltage-ratio responding unit 99 selects the operation mode MD1 and stops the operation of the second control unit 92 and the fourth control unit 94. As a result, the switching of the control signals $S_{11}$ to $S_{14}$ at times ts1 and ts2 shown in FIG. 5 does not occur. As shown in FIG. 6, the levels of the control signals $S_{11}$ to $S_{14}$ are switched in every half cycle $T_p$.

On the other hand, when the voltage ratio command value α* exceeds the threshold αth, the voltage-ratio responding unit 99 selects the operation mode MD2 and enables the operation of the second control unit 92 and the fourth control unit 94. As a result, as shown in FIG. 5, at times ts1 and ts2, the levels of the control signals $S_{11}$ to $S_{14}$ are complementarily switched. According to the switching, the ON/OFF states of the switching elements $Q_{11}$ to $Q_{14}$ are also switched.

Figure 8:
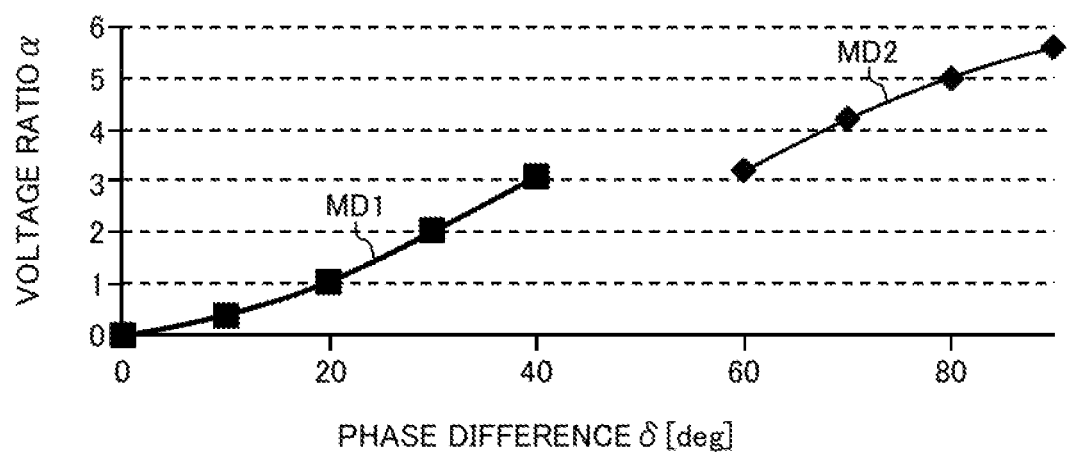
FIG. 8 is a diagram showing a relation among a voltage ratio, a phase difference, and an operation mode.

FIG. 8 is a diagram showing a relation among the voltage ratio α (or the voltage ratio command value α*), the phase difference δ, and the operation modes MD1 and MD2. In an example shown in the figure, the secondary side DC voltage $V_{dc2}$ is set to 500 V, a resistance value of the load 70 is set to 100Ω, and a switching frequency=(1/(2·$T_p$)) is set to 25 kHz. In the example shown in the figure, when the threshold αth is set to "3" and the operation modes MD1 and MD2 are selected, the soft switching can be realized over substantially the entire region of a range in which the voltage ratio α is 0 to 6. Note that the numerical values shown here are examples and do not numerically limit the present invention.

Figure 9:
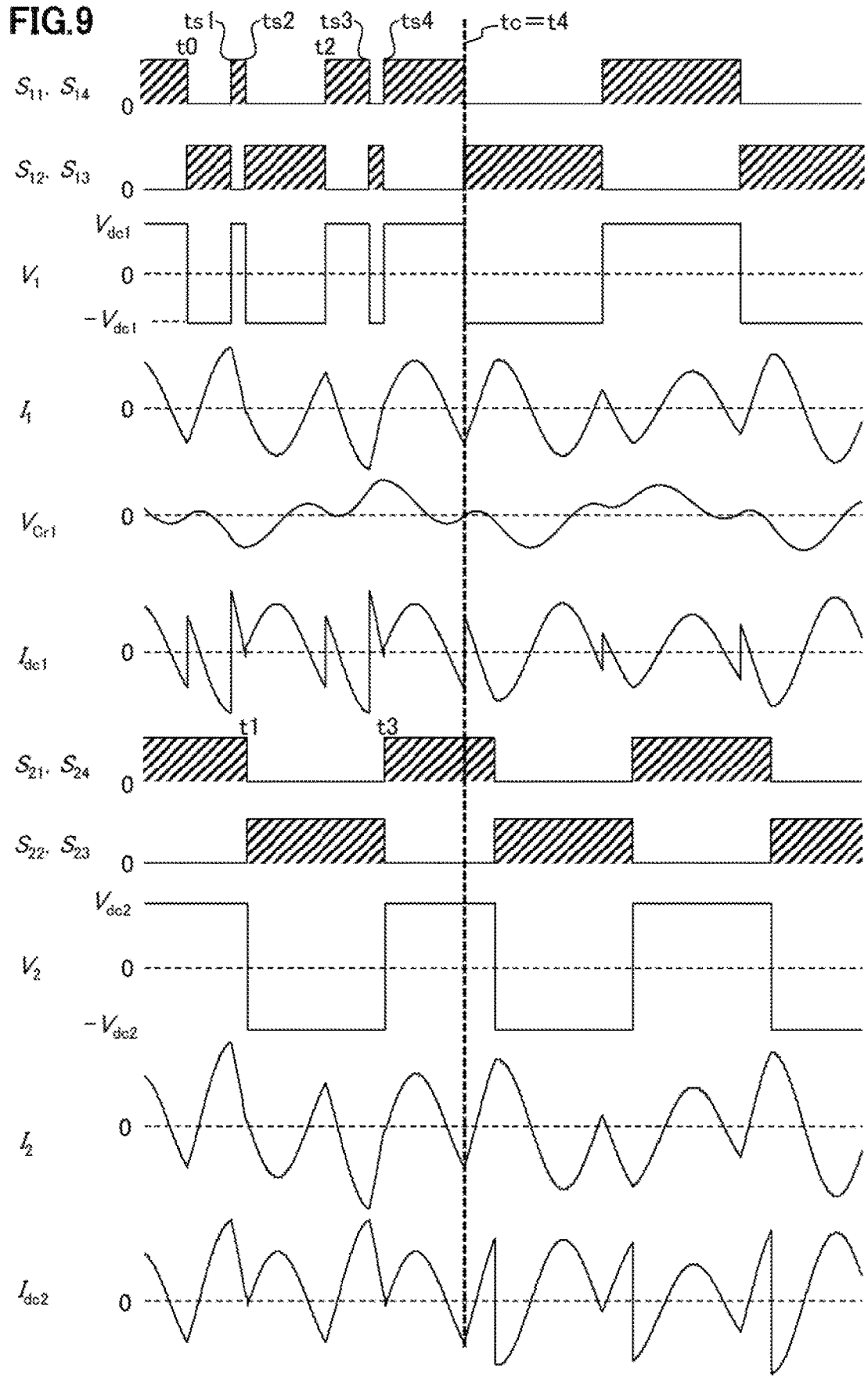
FIG. 9 is a waveform chart of units in the second embodiment.

FIG. 9 is a waveform chart of the units in this embodiment. FIG. 9 shows, in particular, waveforms of the units at the time when the operation modes MD1 and MD2 are switched. In an example shown in the figure, the operation mode MD2 is selected before time tc. The operation mode MD2 is switched to MD1 at time tc. As shown in the figure, operation after the mode switching is easily stabilized if mode switching timing (time tc) is adjusted to rising timing of any one of the control signals $S_{11}$ to $S_{14}$ (in the example shown in FIG. 9, the control signals $S_{12}$ and $S_{13}$).

<Effects of the Second Embodiment>

As explained above, according to this embodiment, the control device (90) further includes the voltage-ratio-command-value receiving unit (98) that receives the voltage ratio command value (α*), which is the command value indicating a quotient of the first DC voltage ($V_{dc1}$) appearing in the first DC system (70) divided by the second DC voltage ($V_{dc2}$) appearing in the second DC system (74) and the voltage-ratio responding unit (99) that stops the operation of the second control unit (92) and the fourth control unit (94) under condition where the voltage ratio command value (α*) is equal to or smaller than a predetermined threshold.

Consequently, it is possible to select an appropriate operation state with respect to a wide range of the voltage ratio α. It is easier to realize soft switching. It is possible to further reduce the switching loss.

Third Embodiment

<Configuration and Operation in a Third Embodiment>

The configuration of a power conversion device A3 according to a third embodiment of the present invention is explained.

Figure 10:
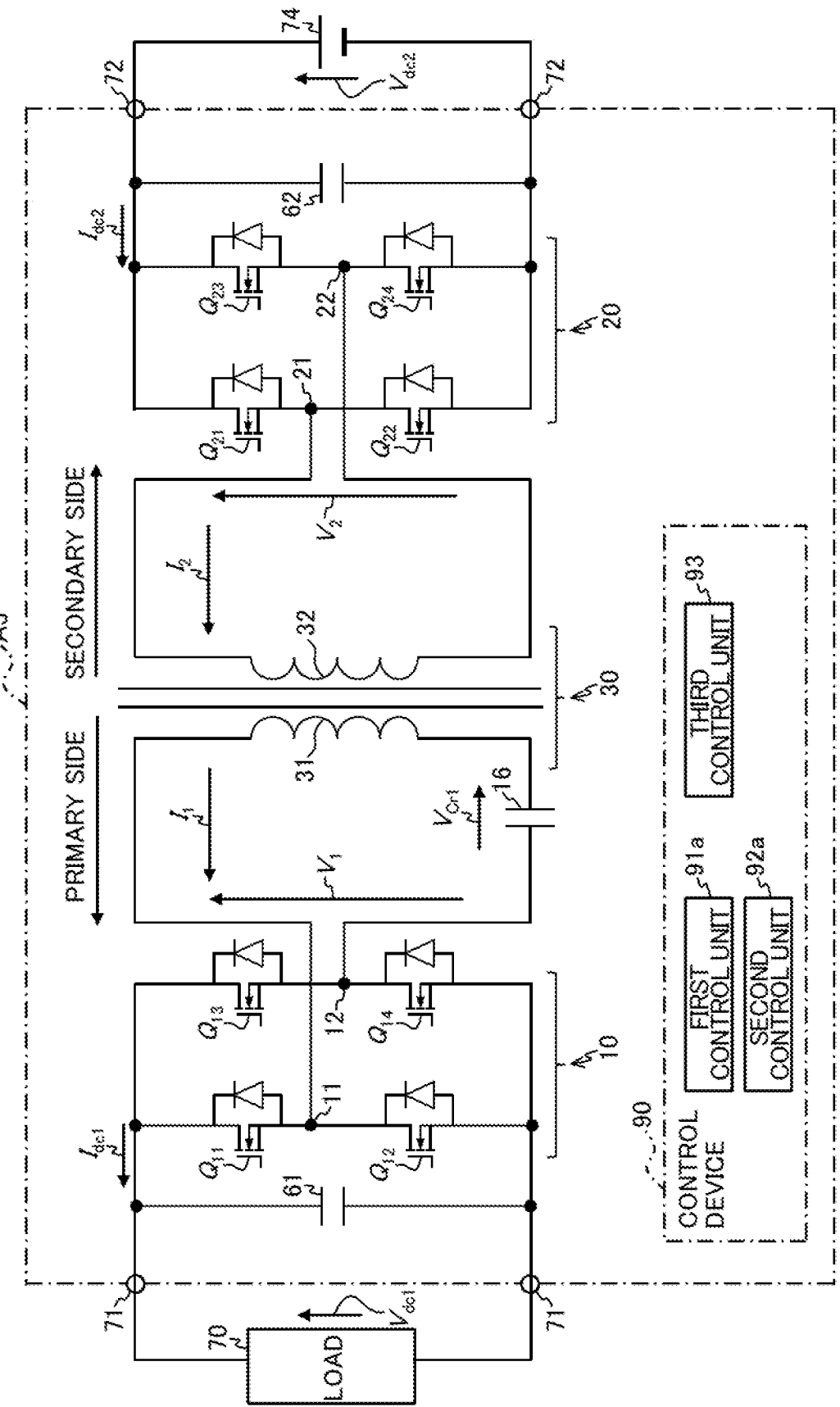
FIG. 10 is a circuit diagram/a block diagram of a power conversion device according to a third embodiment of the present invention.

FIG. 10 is a block diagram of the power conversion device A3.

Note that, in FIG. 10, portions corresponding to the units shown in FIG. 1 to FIG. 9 are denoted by the same reference numerals and signs. Explanation of the portions is sometimes omitted.

A hardware configuration of the power conversion device A3 is the same as the hardware configuration of the power conversion device A1 in the first embodiment. However, the configuration of the control device 90 is different from the configuration in the first embodiment. That is, the control device 90 in this embodiment includes a first control unit 91a, a second control unit 92a, and the third control unit 93. Note that details of the operation of the control units 91a, 92a, and 93 are explained blow.

Figure 11:
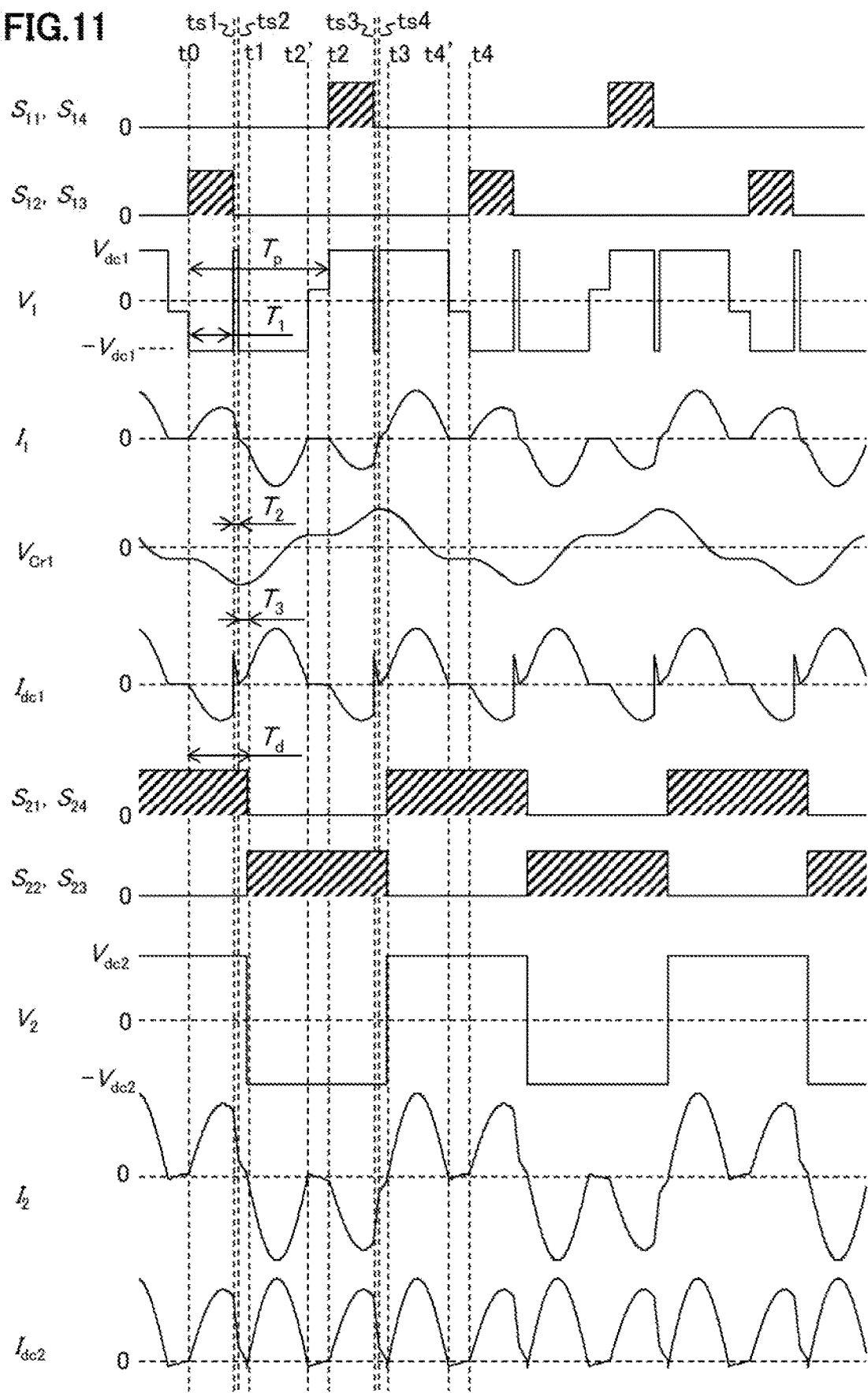
FIG. 11 is a waveform chart of units in the third embodiment.

FIG. 11 is a waveform chart of the units in the power conversion device A3.

At time t0 in FIG. 11, the first control unit 91a (see FIG. 10) raises the control signals $S_{12}$ and $S_{13}$ to the H level and maintains the control signals $S_{11}$ and $S_{14}$ at the L level. At time t2 after elapse of the half cycle $T_p$ from time t0, the first control unit 91a raises the control signals $S_{11}$ and $S_{14}$ to the H level and maintains the control signals $S_{12}$ and $S_{13}$ at the L level.

At time ts1 when the predetermined period $T_1$ elapses from time t0, the second control unit 92a (see FIG. 10) lowers the control signals $S_{12}$ and $S_{13}$ to the L level and maintains the control signals $S_{11}$ and $S_{14}$ at the L level. At time ts3 after the half cycle $T_p$ elapses from time ts1, the second control unit 92a lowers the control signals $S_{11}$ and $S_{14}$ to the L level and maintains the control signals $S_{12}$ and $S_{13}$ at the L level. Thereafter, the first and second control units 91a and 92a repeat the same operation in every cycle 2·$T_p$.

The operation of the third control unit 93 (see FIG. 10) is the same as the operation in the first embodiment. That is, at time t1 when the period $T_d$ corresponding to the phase difference δ elapses from time t0, the third control unit 93 lowers the control signals $S_{21}$ and $S_{24}$ to the L level and raises the control signals $C_{22}$ and $C_{23}$ to the H level. Thereafter, the third control unit 93 complementarily switches the H/L levels of the control signals $S_{21}$ to $S_{24}$ in every half cycle $T_p$. Consequently, the levels of the control signals $S_{21}$ to $S_{24}$ repeat the same pattern in the cycles of 2·$T_p$.

Operation based on the control signals $S_{11}$ to $S_{14}$ and $S_{21}$ to $S_{24}$ explained above are explained in detail below.

Immediately before time t0 explained above, the primary side AC current $I_1$ is zero. All the control signals $S_{11}$ to $S_{14}$ are at the L level. Therefore, the primary side AC voltage $V_1$ is indefinite. When the control signals $S_{12}$ and $S_{13}$ rise to the H level at time t0, the switching elements $Q_{12}$ and $Q_{13}$ (FIG.

10) are switched to the ON state. In this case, since the primary side AC current $I_1$ is originally zero, the turn-on of the switching elements $Q_{12}$ and $Q_{13}$ can be realized by the soft switching.

Thereafter, the primary side AC voltage $V_1$ is retained at $-V_{dc1}$ until the predetermined period $T_1$ elapses. Consequently, the primary side AC current $I_1$ gradually increases in this period. The secondary side AC current $I_2$ also increases substantially proportional to the primary side AC current $I_1$. Note that a determination method for the predetermined period $T_1$ is explained below.

At time ts1 when the predetermined period $T_1$ elapses from time t0, the second control unit 92a lowers the control signals $S_{12}$ and $S_{13}$ to the L level and starts the slit period $T_2$. That is, the second control unit 92a reverses the polarity of the primary side AC voltage $V_1$ and switches the polarity of the primary side DC current $I_{dc1}$. As in the case of the first embodiment, this operation can be realized by the soft switching.

At time ts1, the polarity of the primary side AC voltage $V_1$ is reversed. The primary side AC current $I_1$ and the secondary side AC current $I_2$ start to decrease. At time ts2 when the slit period $T_2$ ends, the primary side AC current $I_1$ is slightly smaller than 0 and has a negative value. In this embodiment, at time ts2, all the control signals $S_{11}$ to $S_{14}$ are maintained at the L level. However, the polarities of the primary side Ac voltage $V_1$ and the primary side AC current $I_1$ are reversed through the process of steps SA2 and SA3 shown in FIG. 3.

Since all the control signals $S_{11}$ to $S_{14}$ are at the L level in this way, a switching loss does not occur. The secondary side AC current $I_2$ is substantially proportional to the primary side AC current $I_1$. However, a response is slightly slow compared with the primary side AC current $I_1$. The secondary side AC current $I_2$ maintains a positive value even at time t1 when the predetermined period $T_3$ elapses from time ts2. Therefore, as in the first embodiment, the third control unit 93 (see FIG. 1) complementarily switches the H/L levels of the control signals $S_{21}$ to $S_{24}$ at timing of time t1.

At time t1, the secondary side AC current $I_2$ has a positive value. Therefore, when the H/L levels of the control signals $S_{21}$ and $S_{23}$ are complementarily switched from a state where the control signals $S_{21}$ and $S_{24}$ are at the H level, such switching can also be realized by the soft switching. When the levels of the control signals $S_{21}$ to $S_{24}$ are complementarily switched at time t1, the polarity of the secondary side AC voltage $V_2$ is reversed. Consequently, the primary side and secondary side AC currents $I_1$ and $I_2$ decrease (absolute values increase). The absolute value of the resonance capacitor voltage $V_{Cr1}$ decreases. The primary and secondary side AC currents $I_1$ and $I_2$ increase (absolute values decrease).

At time t2' slightly before time t2, the primary side and secondary side AC currents $I_1$ and $I_2$ decrease to zero. The primary side AC voltage $V_1$ become indefinite. When the control signals $S_{11}$ and $S_{14}$ rise to the H level at time t2, the switching elements $Q_{11}$ and $Q_{14}$ are switched to the ON state. Operation at times t2 to t4 is the same as the operation at times t0 to t2 except that the switching elements switched to the ON state are $Q_{11}$ and $Q_{14}$ and that polarities of voltages and electric currents in the units are reversed. Thereafter, the same operation as the operation at times t0 to t4 is repeated in every cycle $2 \cdot T_p$. Note that a determination method for the predetermined period $T_1$, the period $T_d$, and the like in this embodiment are the same as the determination method in the first embodiment.

<Effects of the Third Embodiment>

As explained above, according to this embodiment, it is easy to realize the soft switching as in the first embodiment. It is possible to reduce the switching loss.

Fourth Embodiment

The configuration of a power conversion device A4 according to a fourth embodiment of the present invention is explained.

Figure 12:
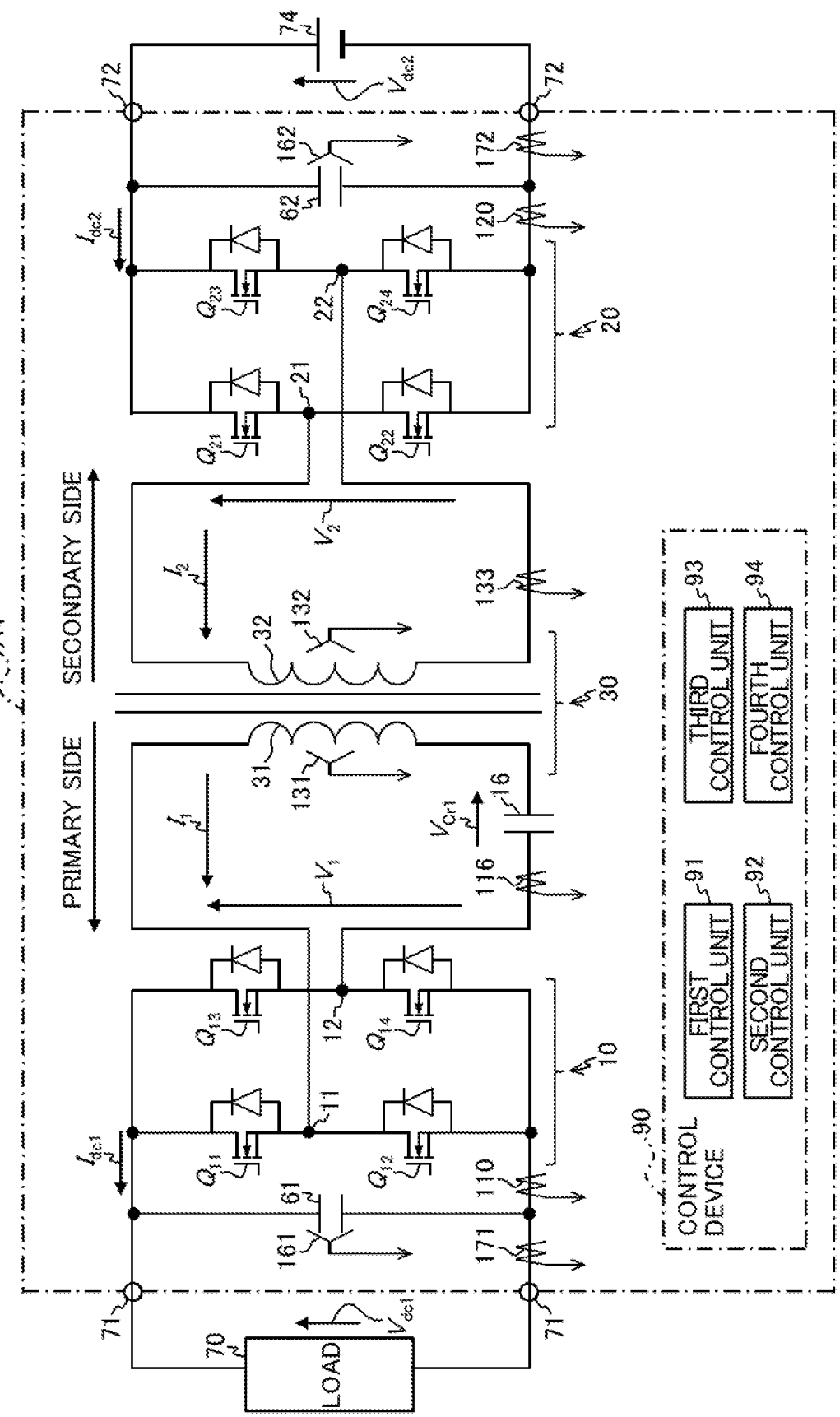
FIG. 12 is a circuit diagram/a block diagram of a power conversion device according to a fourth embodiment of the present invention.

FIG. 12 is a block diagram of the power conversion device A4.

Note that, in FIG. 12, portions corresponding to the units shown in FIG. 1 to FIG. 11 are denoted by the same reference numerals and signs. Explanation of the portions is sometimes omitted.

A hardware configuration of the power conversion device A4 is the same as the hardware configuration of the power conversion device A1 in the first embodiment. However, the hardware configuration is different in that sensors are disposed in the units.

That is, a current sensor 171 measures an electric current flowing to the primary side terminal 71. A current sensor 110 measures the primary side DC current $I_{dc1}$. A voltage sensor 161 measures the primary side DC voltage $V_{dc1}$. A current sensor 116 measures the primary side AC current $I_1$. A voltage sensor 131 measures a terminal voltage of the primary winding 31. A voltage sensor 132 measures a terminal voltage of the secondary winding 32, that is, the secondary side AC voltage $V_2$. A current sensor 133 measures the secondary side AC current $I_2$. A current sensor 120 measures the secondary side DC current $I_{dc2}$. A voltage sensor 162 measures the secondary side DC voltage $V_{dc2}$. A current sensor 172 measures an electric current flowing to the secondary side terminal 72.

The control device 90 includes the first to forth control units 91 to 94 like the control device 90 in the first embodiment. However, in this embodiment, the first to fourth control units 91 to 94 do not switch the H/L levels of the control signals $S_{11}$ to $S_{14}$ and $S_{21}$ to $S_{24}$ at predetermined timings. The first to fourth control units 91 to 94 determine timings for switching the H/L levels of the control signals $S_{11}$ to $S_{14}$ and $S_{21}$ to $S_{24}$ on the basis of measurement results of the sensors 110, 116, 120, 131, 133, 161, 162, and 171. Note that not all of the sensors shown in FIG. 12 need to be provided. Sensors other than the sensors shown in FIG. 12 may be provided.

According to this embodiment, the same effects as the effects of the first embodiment are achieved. Even when a circuit constant changes because of a temperature rise or aged deterioration, timings for switching the H/L levels of the control signals $S_{11}$ to $S_{14}$ and $S_{21}$ to $S_{24}$ can be controlled on the basis of the sensor measurement results. Therefore, it is easier to realize the soft switching. It is possible to further reduce the switching loss.

[Modification]

The present invention is not limited to the embodiments explained above. Various modifications are possible. The embodiments explained above are illustrated to explain the present invention to be easily understood. The embodiments are not always limited to embodiments including all the explained components. Apart of the components in the embodiment can be replaced with the components of the other embodiments. The components of the other embodiments can be added to the components of a certain embodiment. A part of the components of the embodiments can be deleted or other components can be added and replaced. As control lines and information lines shown in the figures, control lines and information lines necessary for explanation are shown. Not all of control lines and information lines necessary in a product are shown. Actually, substantially all the components may be considered to be connected to one another. Modifications possible for the embodiments are, for example, modifications explained below.

(1) The hardware of the control device 90 in the embodiments can be realized by a general computer. Therefore, a program and the like for realizing the waveform charts shown in FIG. 5, FIG. 6, FIG. 9, and FIG. 11 may be stored in a storage medium and distributed via a transmission line.

(2) In the embodiments, the processing for realizing the waveform charts shown in FIG. 5, FIG. 6, FIG. 9, and FIG. 11 is explained as the software processing performed using the program. However, a part or the entire processing may be replaced with hardware processing performed using an ASIC (Application Specific Integrated Circuit) or an FPGA (field-programmable gate array).

(3) In the embodiments, the slit period $T_2$ is provided for the control signals $S_{11}$ to $S_{14}$ to the primary side bridge circuit 10. However, the slit period $T_2$ may be provided for the control signals $S_{21}$ to $S_{24}$ to the secondary side bridge circuit 20.

Figure 13:
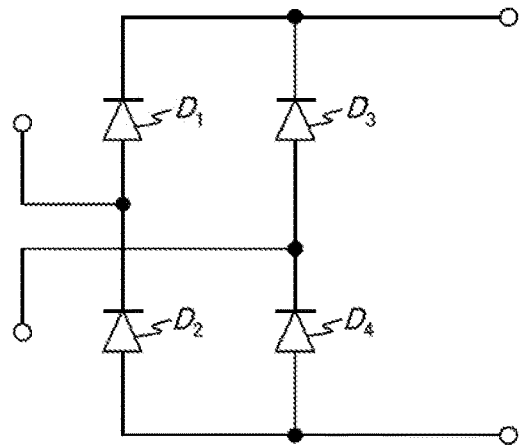
FIG. 13 is a circuit diagram of a bridge circuit in a modification.

(4) In the embodiments, the primary side and secondary side bridge circuits 10 and 20 are configured using the switching elements $Q_{11}$ to $Q_{14}$ and $Q_{21}$ to $Q_{24}$ such that the direction of the power flow can be optionally set from the secondary side to the primary side or from the primary side to the secondary side. However, when the direction of the power flow is only one direction, the slit period $I_2$ may be provided for a bridge side on a power transmission side and a diode bridge circuit may be applied as a bridge circuit on a power receiving side. FIG. 13 is an example of a circuit diagram of the diode bridge circuit. The diode bridge circuit includes diodes $D_1$ to $D_4$.

Figure 14A:
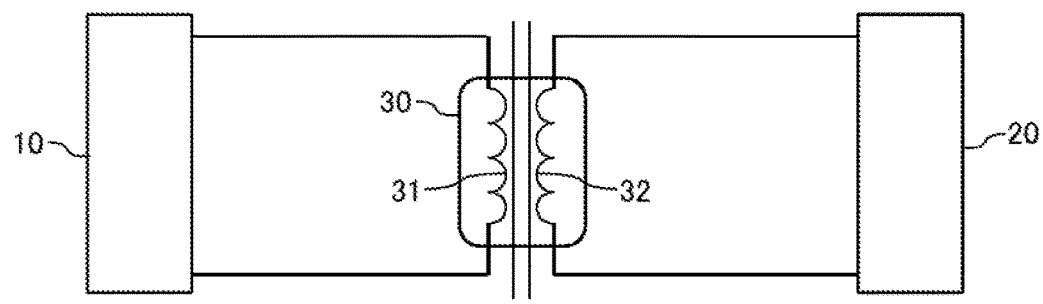
FIGS. 14A to 14C are circuit diagrams of a main part in other modifications.

(5) In the embodiments, the resonance capacitor 16 is connected in series to the primary winding 31 of the transformer 30. However, as shown in FIG. 14A, the primary side bridge circuit 10, the transformer 30, and the secondary side bridge circuit 20 may be connected not via a resonance capacitor.

Figure 14B:
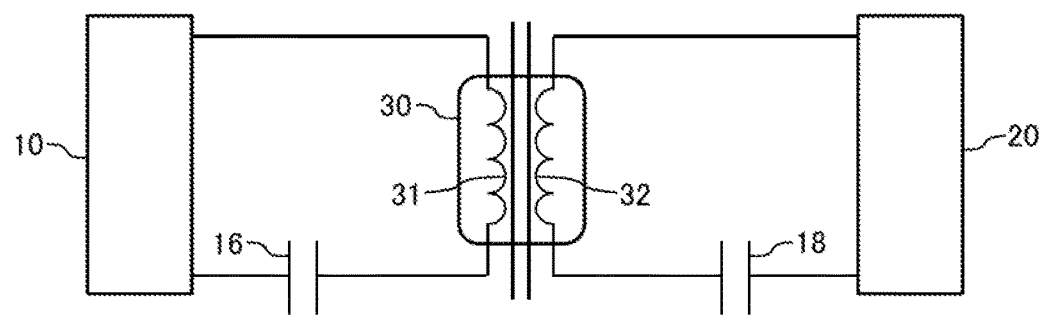

As shown in FIG. 14B, a resonance capacitor 18 may be connected in series to the secondary winding 32 in addition to the resonance capacitor 16 connected to the primary winding 31.

Figure 14C:
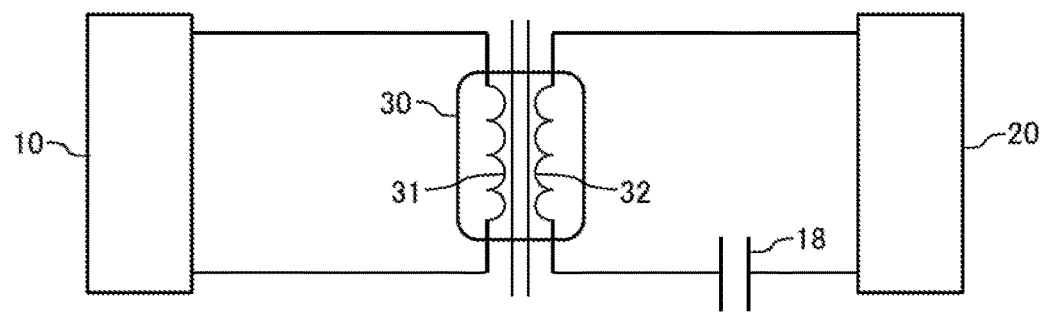

As shown in FIG. 14C, a capacitor may not be connected to the primary winding 31. The resonance capacitor 18 may be connected in series to the secondary winding 32.

(6) The power conversion devices A1 to A4 in the embodiments are the DC-DC converters. However, an AC-DC conversion device (not shown in the figure) may be inserted into the primary side terminal 71 or the secondary side terminal 72 to configure an AC-DC converter. Note that the AC-DC conversion device can be realized by the same bridge circuit as the primary side and secondary side bridge circuits 10 and 20. Further, AC-DC conversion devices may be inserted into both of the primary side terminal 71 and the secondary side terminal 72 to configure an AC-AC converter. The AC-DC converter or the AC-AC converter configured as explained above may be connected in multiple stages in series to configure a so-called series regulator.

(7) In the embodiments, the example is explained in which the MOSFET is applied as the switching element. However, the switching element may be an element other than the MOSFET, for example, an IGBT (Insulated Gate Bipolar Transistor), a bipolar transistor, a vacuum tube such as a thyratron, or a mercury rectifier of a vacuum tube type. When a semiconductor is used as the switching element, the material of the semiconductor may be any of Si, SiC, GaN, and the like.

REFERENCE SIGNS LIST

10 primary side bridge circuit
11 connection point (first connection point)
12 connection point (second connection point)
16, 18 resonance capacitor
20 secondary side bridge circuit
21 connection point (third connection point)
22 connection point (fourth connection point)
30 transformer
31 primary winding (first winding)
32 secondary winding (second winding)
70 load (first DC system)
74 DC voltage source (second DC system)
90 control device (power conversion device control device)
91, 91a first control unit
92, 92a second control unit
93 third control unit
94 fourth control unit
98 voltage-ratio-command-value receiving unit
99 voltage-ratio responding unit
$\alpha^*$ voltage ratio command value
$\alpha$th threshold
$\alpha$ voltage ratio
$\delta$ phase difference
A1 to A4 power conversion device
$I_1$ primary side AC current (first current)
$I_2$ secondary side AC current (second current)
$Q_{11}$ to $Q_{14}$ switching element (first to fourth switching elements)
$Q_{21}$ to $Q_{24}$ switching element (fifth to eighth switching elements)
$T_1$ predetermined period (first predetermined period)
$T_1$ slit period (second predetermined period)
$V_1$ primary side AC voltage (first voltage)
$V_2$ secondary side AC voltage (second voltage)
$V_{dc1}$ primary side DC voltage (first DC voltage)
$V_{dc2}$ secondary side DC voltage (second DC voltage)

The invention claimed is:

1. A power conversion device comprising:
   first and second switching elements connected in series via a first connection point between a positive electrode and a negative electrode of a first DC system;
   third and fourth switching elements connected in series via a second connection point between the positive electrode and the negative electrode of the first DC system;
   fifth and sixth switching elements connected in series via a third connection point between a positive electrode and a negative electrode of a second DC system;
   seventh and eighth switching elements connected in series via a fourth connection point between the positive electrode and the negative electrode of the second DC system;
   a transformer including a first winding connected between the first and second connection points, a first voltage appearing between both ends of the first winding, a first current flowing through the first winding, and a second winding connected between the third and fourth connection points, a second voltage appearing both ends of the second winding, a second current flowing through the second winding; and a control device that controls ON/OFF states of the first to eighth switching elements, the control device includes:
a first control unit that repeats, in every predetermined cycle in a state where the second and third switching elements are in the OFF state and an absolute value of the first current is equal to or smaller than a peak value of the first current, an operation including causing a positive electrode of the first voltage to appear at the second connection point by switching the second and third switching elements to the ON state;

a second control unit that repeats, in the every cycle when a first predetermined period elapses after the first control unit operates, an operation including causing the positive electrode of the first voltage to appear at the first connection point by switching the second and third switching elements to the OFF state; and a third control unit that repeats, in the every cycle after the second control unit operates and after the positive electrode of the first voltage appears at the second connection point, an operation including switching the fifth and eighth switching elements to the OFF state and switching the sixth and seventh switching elements to the ON state, wherein the first control unit switches the first and fourth switching elements to the OFF state when switching the second and third switching elements to the ON state, the second control unit switches the first and fourth switching elements to the ON state when switching the second and third switching elements to the OFF state, and the control device further includes a fourth control unit that switches the first and fourth switching elements to the OFF state and switches the second and third switching elements to the ON state in a state where an absolute value of the first current is $1/10$ or less of the peak value of the first current when a second predetermined period elapses after the second control unit operates, and wherein a first DC voltage appearing in the first DC system is two to seven times as large as a second DC voltage appearing in the second DC system, and wherein the control device further includes:
a voltage-ratio-command-value receiving unit that receives a voltage ratio command value, which is a command value indicating a quotient of the first DC voltage appearing in the first DC system divided by the second DC voltage appearing in the second DC system; and a voltage-ratio responding unit that stops the operation of the second control unit and the fourth control unit under condition where the voltage ratio command value is equal to or smaller than a predetermined threshold.

2. The power conversion device according to claim 1, wherein the third control unit switches the fifth and eighth switching elements to the OFF state and switches the sixth and seventh switching elements to the ON state when a third period elapses after the fourth control unit operates.

3. A power conversion device control device that controls ON/OFF states of first to eighth switching elements in the power conversion device, the power conversion device including:
the first and second switching elements connected in series via a first connection point between a positive electrode and a negative electrode of a first DC system;

the third and fourth switching elements connected in series via a second connection point between the positive electrode and the negative electrode of the first DC system;

the fifth and sixth switching elements connected in series via a third connection point between a positive electrode and a negative electrode of a second DC system;

the seventh and eighth switching elements connected in series via a fourth connection point between the positive electrode and the negative electrode of the second DC system; and a transformer including a first winding connected between the first and second connection points, a first voltage appearing between both ends of the first winding, a first current flowing through the first winding, and a second winding connected between the third and fourth connection points, a second voltage appearing both ends of the second winding, a second current flowing through the second winding, the power conversion device control device comprising:
a first control unit that repeats, in every predetermined cycle in a state where the second and third switching elements are in the OFF state and an absolute value of the first current is equal to or smaller than a peak value of the first current, an operation including causing a positive electrode of the first voltage to appear at the second connection point by switching the second and third switching elements to the ON state;

a second control unit that repeats, in the every cycle when a first predetermined period elapses after the first control unit operates, an operation including causing the positive electrode of the first voltage to appear at the first connection point by switching the second and third switching elements to the OFF state; and a third control unit that repeats, in the every cycle after the second control unit operates and after the positive electrode of the first voltage appears at the second connection point, an operation including switching the fifth and eighth switching elements to the OFF state and switching the sixth and seventh switching elements to the ON state, wherein the first control unit switches the first and fourth switching elements to the OFF state when switching the second and third switching elements to the ON state, the second control unit switches the first and fourth switching elements to the ON state when switching the second and third switching elements to the OFF state, and the control device further includes a fourth control unit that switches the first and fourth switching elements to the OFF state and switches the second and third switching elements to the ON state in a state where an absolute value of the first current is $1/10$ or less of the peak value of the first current when a second predetermined period elapses after the second control unit operates, and wherein a first DC voltage appearing in the first DC system is two to seven times as large as a second DC voltage appearing in the second DC system, and wherein the control device further includes:
a voltage-ratio-command-value receiving unit that receives a voltage ratio command value, which is a command value indicating a quotient of the first DC voltage appearing in the first DC system divided by the second DC voltage appearing in the second DC system; and a voltage-ratio responding unit that stops the operation of the second control unit and the fourth control unit under condition where the voltage ratio command value is equal to or smaller than a predetermined threshold.

4. A power conversion device control method for controlling a power conversion device including:

first and second switching elements connected in series via a first connection point between a positive electrode and a negative electrode of a first DC system;

third and fourth switching elements connected in series via a second connection point between the positive electrode and the negative electrode of the first DC system;

fifth and sixth switching elements connected in series via a third connection point between a positive electrode and a negative electrode of a second DC system;

seventh and eighth switching elements connected in series via a fourth connection point between the positive electrode and the negative electrode of the second DC system; and a transformer including a first winding connected between the first and second connection points, a first voltage appearing between both ends of the first winding, a first current flowing through the first winding, and a second winding connected between the third and fourth connection points, a second voltage appearing both ends of the second winding, a second current flowing through the second winding, the power conversion device control method comprising:

a first step of repeating, in every predetermined cycle in a state where the second and third switching elements are in the OFF state and an absolute value of the first current is equal to or smaller than a peak value of the first current, an operation including causing a positive electrode of the first voltage to appear at the second connection point by switching the second and third switching elements to the ON state;

a second step of repeating, in the every cycle when a first predetermined period elapses after the first step, an operation including causing the positive electrode of the first voltage to appear at the first connection point by switching the second and third switching elements to the OFF state; and a third step of repeating, in the every cycle after the second step and after the positive electrode of the first voltage appears at the second connection point, an operation including switching the fifth and eighth switching elements to the OFF state and switching the sixth and seventh switching elements to the ON state, wherein the first and fourth switching elements are switched to the OFF state when switching the second and third switching elements to the ON state, the first and fourth switching elements are switched to the ON state when switching the second and third switching elements to the OFF state, and the first and fourth switching elements are switched to the OFF state and the second and third switching elements are switched to the ON state in a state where an absolute value of the first current is $1/10$ or less of the peak value of the first current when a second predetermined period elapses after the first and fourth switching elements are switched to the ON state, and wherein a first DC voltage appearing in the first DC system is two to seven times as large as a second DC voltage appearing in the second DC system, the method further comprising:

receiving a voltage ratio command value, which is a command value indicating a quotient of the first DC voltage appearing in the first DC system divided by the second DC voltage appearing in the second DC system; and stopping the second step under condition where the voltage ratio command value is equal to or smaller than a predetermined threshold.

* * * * *